(12) United States Patent
An et al.

(10) Patent No.: US 11,563,440 B2
(45) Date of Patent: Jan. 24, 2023

(54) ANALOG-TO-DIGITAL CONVERTER AND ANALOG-TO-DIGITAL CONVERSION METHOD THEREOF

(71) Applicant: Samsung Electronics Co., Ltd., Suwon-si (KR)

(72) Inventors: Tai Ji An, Seoul (KR); Jun Sang Park, Seoul (KR); Gil Cho Ahn, Seoul (KR); Seung Hoon Lee, Seoul (KR); Yong Tae Kim, Seoul (KR); Kee Ho Ryu, Yongin-si (KR); Seung Hoon Lee, Hwaseong-si (KR); Je Min Jeon, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/337,505

(22) Filed: Jun. 3, 2021

(65) Prior Publication Data

US 2022/0077867 A1    Mar. 10, 2022

(30) Foreign Application Priority Data

Sep. 8, 2020    (KR) .......................... 10-2020-0114313

(51) Int. Cl.
*H03M 1/12* (2006.01)
*H03M 1/10* (2006.01)

(52) U.S. Cl.
CPC ................................. *H03M 1/1014* (2013.01)

(58) Field of Classification Search
CPC .... H03M 1/468; H03M 1/804; H03M 1/1245; H03M 1/38; H03M 1/466; H03M 1/462;
(Continued)

(56) References Cited

U.S. PATENT DOCUMENTS 5,684,487 A * 11/1997 Timko ................ H03M 1/1047
341/172
6,144,331 A * 11/2000 Jiang ................... H03M 1/0682
341/172

(Continued)

FOREIGN PATENT DOCUMENTS

KR    10-1140349 B1    5/2012
KR    10-1191054 B1    10/2012

(Continued)

*Primary Examiner* — Linh V Nguyen
(74) *Attorney, Agent, or Firm* — Harness, Dickey & Pierce, P.L.C.

(57) ABSTRACT

An analog-to-digital conversion device and analog-to-digital conversion method thereof are provided. The analog-to-digital conversion device includes an analog circuit configured to output an analog input signal, and an analog-to-digital converter configured to receive the analog input signal and configured to outputting a digital output signal corresponding to the analog input signal with the use of first and second capacitor arrays, each of the first and second capacitor arrays including a first capacitor having a calibration capacitor connected thereto and a second capacitor having no calibration capacitor connected thereto, wherein the analog-to-digital converter is configured to calibrate the capacitance of the first capacitor by providing a first calibration voltage to the calibration capacitor and is configured to output the digital output signal corresponding to the analog input signal with the use of the calibrated capacitance of the first capacitor.

19 Claims, 23 Drawing Sheets

(58) Field of Classification Search
CPC ........ H03M 1/46; H03M 1/12; H03M 1/1009;
H03M 1/002; H03M 1/1061; H03M
1/1057; H03M 1/0682; H03M 1/403;
H03M 1/66; H03M 1/1023; H03M 1/10;
H03M 1/00; H03M 1/1038; H03M 1/442;
H03M 1/1071; H03M 3/464; H03M
1/0678; H03M 1/0607
USPC .................................. 341/118–121, 155, 172
See application file for complete search history.

(56) References Cited

U.S. PATENT DOCUMENTS

| | | | | |
|---|---|---|---|---|
| 6,448,911 B1 * | 9/2002 | Somayajula | ........ | H03M 1/1061 |
| | | | | 341/172 |
| 6,707,403 B1 * | 3/2004 | Hurrell | ............... | H03M 1/1061 |
| | | | | 341/172 |
| 6,985,101 B2 * | 1/2006 | Leung | ................. | H03M 1/1057 |
| | | | | 341/172 |
| 7,893,860 B2 | 2/2011 | Cho et al. | | |
| 7,944,387 B2 * | 5/2011 | Ohnhaeuser | .......... | H03M 1/002 |
| | | | | 341/172 |
| 8,159,382 B2 * | 4/2012 | Srinivasa | .............. | H03M 1/002 |
| | | | | 341/172 |
| 8,164,504 B2 | 4/2012 | Cho et al. | | |
| 8,395,538 B2 * | 3/2013 | Das | ........................ | H03M 1/68 |
| | | | | 341/172 |
| 8,981,973 B2 | 3/2015 | Kumar | | |
| 9,106,246 B2 | 8/2015 | Yang | | |
| 9,467,159 B1 * | 10/2016 | Tai | ...................... | H03M 1/1057 |
| 9,531,400 B1 * | 12/2016 | Wen | .................... | H03M 1/0692 |
| 9,780,804 B1 * | 10/2017 | Chowdhury | ........... | H03M 1/68 |
| 10,097,198 B1 | 10/2018 | Lee et al. | | |
| 10,581,443 B2 | 3/2020 | Vinje et al. | | |
| 2010/0001892 A1 * | 1/2010 | Aruga | ................. | H03M 1/1047 |
| | | | | 341/172 |
| 2018/0269893 A1 * | 9/2018 | Chang | ................ | H03M 1/0682 |

FOREIGN PATENT DOCUMENTS

| | | |
|---|---|---|
| KR | 10-1512098 B1 | 4/2015 |
| KR | 10-2075653 B1 | 2/2020 |

* cited by examiner

ANALOG-TO-DIGITAL CONVERTER AND ANALOG-TO-DIGITAL CONVERSION METHOD THEREOF

CROSS-REFERENCE TO RELATED APPLICATION

This application claims priority to Korean Patent Application No. 10-2020-0114313, filed on Sep. 8, 2020, and all the benefits accruing therefrom under 35 U.S.C. § 119, the disclosure of which is incorporated herein incorporated by reference.

BACKGROUND

1. Field

The present disclosure relates to an analog-to-digital converter (ADC) and an analog-to-digital conversion method thereof.

2. Description of the Related Art

An analog-to-digital converter (ADC) is a device used to generate a sequence of digital codes representing the levels of analog signals.

As a type of ADC, there exists a successive approximation register analog-to-digital converter (SAR ADC) comparing data via repeated analog-to-digital conversion and determining the bits of digital code.

SUMMARY

Embodiments of the present disclosure provide a semiconductor device having an improved or reduced circuit complexity and including capacitors with an improved linearity.

Embodiments of the present disclosure also provide an analog-to-digital conversion method a semiconductor device having an improved or reduced circuit complexity and including capacitors with an improved linearity.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to example embodiments of the present disclosure, an analog-to-digital conversion device including an analog circuit configured to output an analog input signal, and an analog-to-digital converter configured to receive the analog input signal and configured to output a digital output signal corresponding to the analog input signal with the use of first and second capacitor arrays, each of the first and second capacitor arrays including a first capacitor having a calibration capacitor connected thereto and a second capacitor having no calibration capacitor connected thereto, wherein the analog-to-digital converter is configured to calibrate the capacitance of the first capacitor by providing a first calibration voltage to the calibration capacitor and is configured to output the digital output signal corresponding to the analog input signal with the use of the calibrated capacitance of the first capacitor.

According to the aforementioned and other example embodiments of the present disclosure, an analog-to-digital conversion device including a plurality of upper capacitors configured to determine upper bits of a digital output signal corresponding to an analog input signal, a plurality of calibration capacitors connected to at least some of the upper capacitors, a plurality of lower capacitors configured to determine lower bits of the digital output signal, and a differential reference voltage generation logic configured to receive first and second reference voltages and configured to generate a first differential reference voltage, which is $(1/2)^n$ times the first reference voltage (where n is a natural number), and a second differential reference voltage, which is $(1/2)^n$ times the second reference voltage, wherein the calibration capacitors are configured to receive one of the first and second differential reference voltages from the differential voltage generation logic, the capacitance of the upper capacitors has a binary weight structure due to the calibration capacitors, and the calibration capacitors and the lower capacitors have the same capacitance.

According to the aforementioned and other example embodiments of the present disclosure, an analog-to-digital conversion device including a first capacitor array including a first variable capacitor, which includes a first calibration capacitor having first capacitance, a first non-variable capacitor, which does not include the first calibration capacitor, and a first lower capacitor, a second capacitor array including a second variable capacitor, which includes a second calibration capacitor having second capacitance, a second non-variable capacitor, which does not include the second calibration capacitor, and a second lower capacitor, a comparator including a first node, to which the output of the first capacitor array is connected, and a second node, to which the output of the second capacitor array is connected, a resistor string having a plurality of resistors connected in series and configured to generate a first differential reference voltage, which is obtained by dividing a first reference voltage, and a second differential reference voltage, which is obtained by dividing a second reference voltage, and a calibration logic connecting one of the first and second differential reference voltages to one of the first and second calibration capacitors in accordance with a first output signal of the comparator, wherein the capacitance of the first variable capacitor is changed by the first calibration capacitor, the capacitance of the second variable capacitor is changed by the second calibration capacitor, the first and second lower capacitors have the first capacitance, the capacitances of the first variable capacitor and the first non-variable capacitor have a binary weight structure due to the first calibration capacitor, and the capacitances of the second variable capacitor and the second non-variable capacitor have a binary weight structure due to the second calibration capacitor.

According to the aforementioned and other example embodiments of the present disclosure, an operating method of an analog-to-digital conversion device, comprising, calibrating the capacitance of a variable capacitor by providing a calibration voltage to a calibration capacitor included in the variable capacitor, sampling an analog input signal with the use of the variable capacitor, a non-variable capacitor, which does not include the calibration capacitor, and a lower capacitor, determining upper bits of a digital output signal corresponding to the analog input signal by selectively connecting a reference voltage to the variable capacitor and the non-variable capacitor, and determining lower bits of the digital output signal by selectively connecting a differential reference voltage, which is obtained by dividing the reference voltage, to the lower capacitor, wherein the capacitances of the variable capacitor and the non-variable capacitor have a binary weight structure due to the calibration capacitor, and the calibration capacitor and the lower capacitor have first capacitance.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

Figure 1:
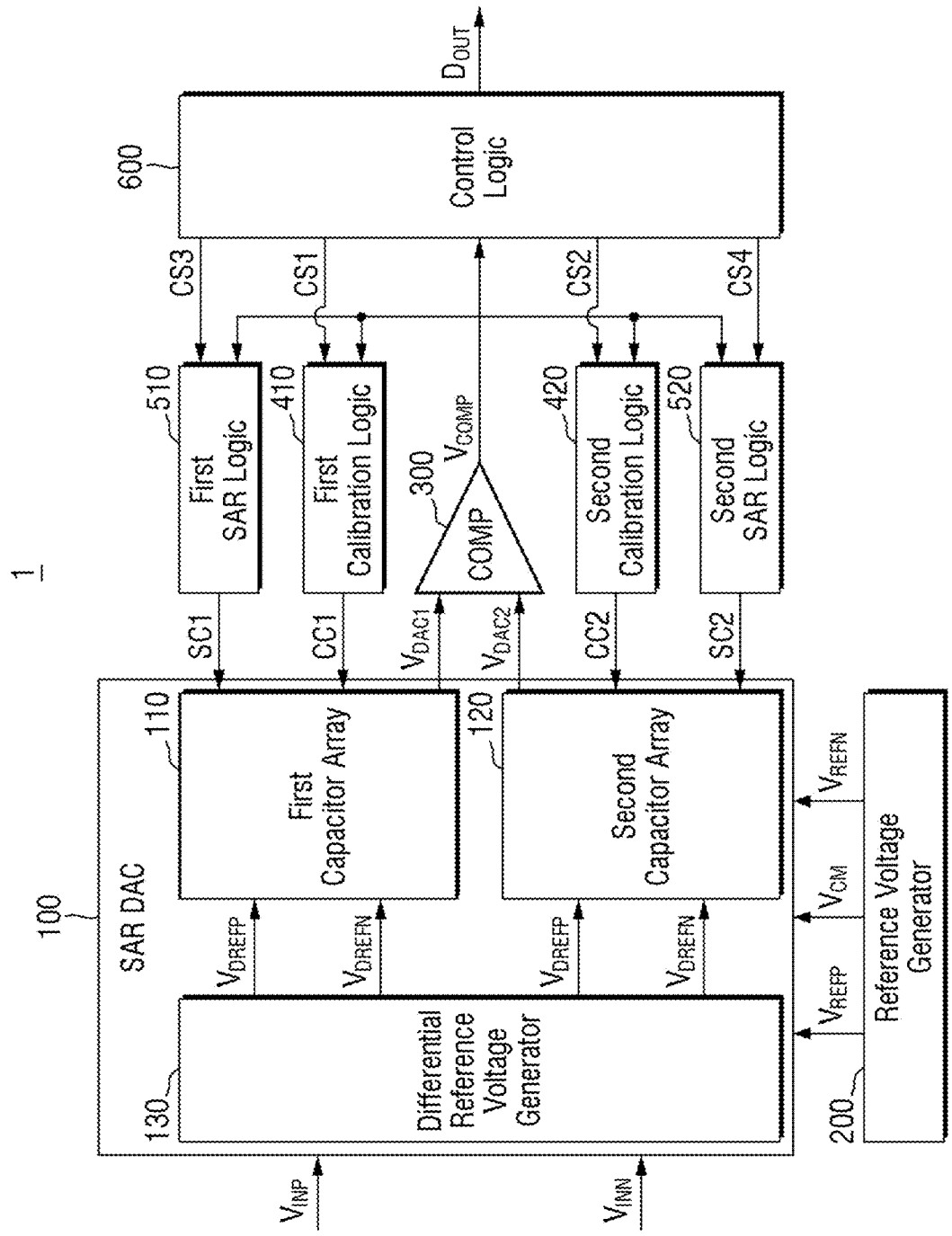
FIG. 1 is a block diagram of a semiconductor device according to some example embodiments of the present disclosure.

FIG. 1 is a block diagram of a semiconductor device according to some example embodiments of the present disclosure.

Referring to FIG. 1, a semiconductor device 1 may include a successive approximation register digital-to-analog converter (SAR DAC) 100, a reference voltage generator 200, a comparator 300, a first calibration logic 410, a second calibration logic 420, a first successive approximation register (SAR) logic 510, a second SAR logic 520, and/or a control logic 600.

In some example embodiments, the display device 1 may be, for example, an analog-to-digital converter (ADC) converting analog input signals $V_{INP}$ and $V_{INN}$ into a digital output signal $D_{OUT}$. For example, the semiconductor device 1 may be, for example, an SAR ADC converting the analog input signals $V_{INP}$ and $V_{INN}$ into a q-bit digital output signal $D_{OUT}$ (where q is a natural number) via successive approximation (SA).

The semiconductor device 1 will hereinafter be described as being an SAR ADC, but the present disclosure is not limited thereto. Alternatively, in other example embodiments, the semiconductor device 1 may be implemented as an ADC other than an SAR ADC, or as a semiconductor device other than an ADC.

Referring to FIG. 1, the SAR DAC 100 may include a first capacitor array 110, a second capacitor array 120, and/or a differential reference voltage generator 130.

The SAR DAC 100 may receive the analog input signals $V_{INP}$ and $V_{INN}$. The SAR DAC 100 may sample and hold the analog input signals $V_{INP}$ and $V_{INN}$. The SAR DAC 100 may store the analog input signals $V_{INP}$ and $V_{INN}$ with the use of a predetermined or alternatively, desired storage element to provide the analog input signals $V_{INP}$ and $V_{INN}$ to the comparator 300.

The SAR DAC 100 may receive a first reference voltage $V_{REFP}$, a common mode voltage $V_{CM}$, and/or a second reference voltage $V_{REFN}$ from the reference voltage generator 200. The common mode voltage $V_{CM}$ may have, for example, a median value between the first and second reference voltages $V_{REFP}$ and $V_{REFN}$.

The differential reference voltage generator 130 may generate a first differential reference voltage $V_{DREFP}$, which is obtained by dividing the first reference voltage $V_{REFP}$, and a second differential reference voltage $V_{DREFN}$, which is obtained by dividing the second reference voltage $V_{REFN}$. The first differential reference voltage $V_{DREFP}$ may be $(1/2)^n$ times the first reference voltage $V_{REFP}$ (where n is a natural number). The second differential reference voltage $V_{DREFN}$ may be $(1/2)^n$ times the second reference voltage $V_{REFN}$ (where n is a natural number).

A first node of the comparator 300 may be connected to a first output voltage $V_{DAC1}$ of the first capacitor array 110. A second node of the comparator 300 may be connected to a second output voltage $V_{DAC2}$ of the second capacitor array 120. The comparator 300 may compare the first output voltage $V_{DAC1}$ of the first capacitor array 110 and the second output voltage $V_{DAC2}$ of the second capacitor array 120 and may output a comparison signal $V_{COMP}$. If the first output voltage $V_{DAC1}$ is higher than the second output voltage $V_{DAC2}$, the comparator 300 may output a first-level comparison signal $V_{COMP}$ having a first level. If the first output voltage $V_{DAC1}$ is lower than the second output voltage $V_{DAC2}$, the comparator 300 may output a second-level comparison signal $V_{COMP}$ having a second level different from the first level.

The first SAR logic 510 may be operated by a third control signal CS3. The first and second SAR logics 510 and 520 may receive the comparison signal $V_{COMP}$ from the comparator 300 and may determine bits of the digital output signal $D_{OUT}$ corresponding to the analog input signals $V_{INP}$ and $V_{INN}$ based on the comparison signal $V_{COMP}$.

The second SAR logic 520 may be operated by a fourth control signal CS4. The first SAR logic 510 may output a first switch control signal SC1 to the first capacitor array 110 based on the comparison signal $V_{COMP}$. The second SAR logic 520 may output a second switch control signal SC2 to the second capacitor array 120 based on the comparison signal $V_{COMP}$.

The first and second logics 510 and 520 are illustrated as being separate logics, but the present disclosure is not limited thereto. Alternatively, the first and second logics 510 and 520 may be implemented as a single logic.

The SAR DAC 100 may control the first output voltage $V_{DAC1}$ to be provided to the comparator 300, in accordance with the first switch control signal SC1. The SAR DAC 100 may control the second output voltage $V_{DAC2}$ to be provided to the comparator 300, in accordance with the second switch control signal SC2. For example, the SAR DAC 100 may control the first and second output voltages $V_{DAC1}$ and $V_{DAC2}$ to be provided to the comparator 300, in accordance with the first and second switch control signals SC1 and SC2. The SAR DAC 100 may generate the first output voltage $V_{DAC1}$ by controlling a plurality of capacitors and a plurality of switches included in the first capacitor array 110 in accordance with the first switch control signal SC1 and may output the first output voltage $V_{DAC1}$ to the comparator 300. Also, the SAR DAC 100 may generate the second output voltage $V_{DAC2}$ by controlling a plurality of capacitors and a plurality of switches included in the second capacitor array 120 in accordance with the second switch control signal SC2 and may output the second output voltage $V_{DAC2}$ to the comparator 300. The SAR DAC 100 may control the first and second output voltages $V_{DAC1}$ and $V_{DAC2}$ using the first capacitor array 110, the capacitance of which is calibrated by a first calibration logic 410 and the second capacitor array 120, the capacitance of which is calibrated by a second calibration logic 420.

The control logic 600 may control the operations of the first calibration logic 410, the second calibration logic 420, the first SAR logic 510, and/or the second SAR logic 520. For example, the control logic 600 may control the timing of the operations of the first calibration logic 410, the second calibration logic 420, the first SAR logic 510, and/or the second SAR logic 520. The first calibration logic 410 may be operated by the first control signal CS1. The first calibration logic 410 may calibrate the capacitors included in the first capacitor array 110 in accordance with the first control signal CS1. The first calibration logic 410 may receive the comparison signal $V_{COMP}$ from the comparator 300 and may output a first calibration signal CC1 to the capacitors included in the first capacitor array 110 based on the comparison signal $V_{COMP}$.

The second calibration logic 420 may be operated by the second control signal CS2. The second calibration logic 420 may calibrate the capacitors included in the second capacitor array 120 in accordance with the second control signal CS2. The second calibration logic 420 may receive the comparison signal $V_{COMP}$ from the comparator 300 and may output a second calibration signal CC2 to the capacitors included in the second capacitor array 120 based on the comparison signal $V_{COMP}$.

The first and second calibration logics 410 and 420 are illustrated as being separate logics, but the present disclosure is not limited thereto. Alternatively, the first and second calibration logics 410 and 420 may be implemented as a single logic.

At least some of the capacitors included in the first capacitor array 110 may receive one of first differential reference voltages $(1/2)V_{REFP}$, $(1/4)V_{REFP}$, $(1/8)V_{REFP}$, $(1/16)V_{REFP}$, and $(1/32)V_{REFP}$ and one of second differential reference voltages $(1/2)V_{REFN}$, $(1/4)V_{REFN}$, $(1/8)V_{REFN}$, $(1/16)V_{REFN}$, and $(1/32)V_{REFN}$ in accordance with the first calibration signal CC1. At least some of the capacitors included in the second capacitor array 120 may receive one of the first differential reference voltages $(1/2)V_{REFP}$, $(1/4)V_{REFP}$, $(1/8)V_{REFP}$, $(1/16)V_{REFP}$, and $(1/32)V_{REFP}$ and one of the second differential reference voltages $(1/2)V_{REFN}$, $(1/4)V_{REFN}$, $(1/8)V_{REFN}$, $(1/16)V_{REFN}$, and $(1/32)V_{REFN}$ in accordance with the second calibration signal CC2. Accordingly, the capacitances of the capacitors included in the first capacitor array 110 can be calibrated, and the capacitances of the capacitors included in the second capacitor array 120 can also be calibrated. This will be described later in detail.

The SAR DAC 100 may generate the first output voltage $V_{DAC1}$ by controlling the capacitors and the switches included in the first capacitor array 110 in accordance with the first calibration signal CC1 and may output the first output voltage $V_{DAC1}$ to the comparator 300. The SAR DAC 100 may generate the second output voltage $V_{DAC2}$ by controlling the capacitors and the switches included in the second capacitor array 120 in accordance with the second calibration signal CC2 and may output the second output voltage $V_{DAC2}$ to the comparator 300.

The control logic 600 may merge bits determined by the first and second SAR logics 510 and 520 and may thereby output the digital output signal $D_{OUT}$.

Figure 2:
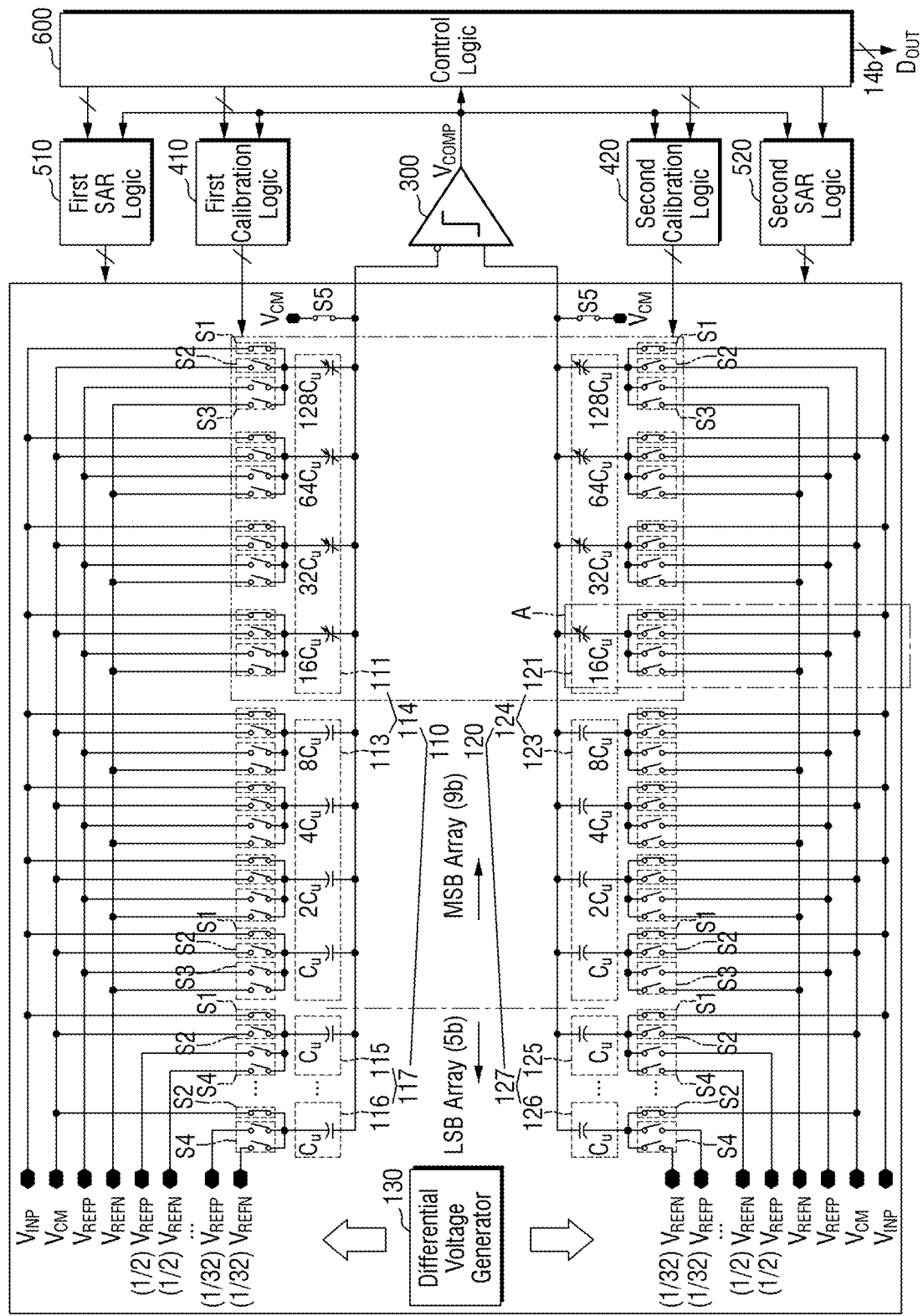
FIG. 2 is a circuit diagram of the SAR DAC of FIG. 1.
Figure 3:
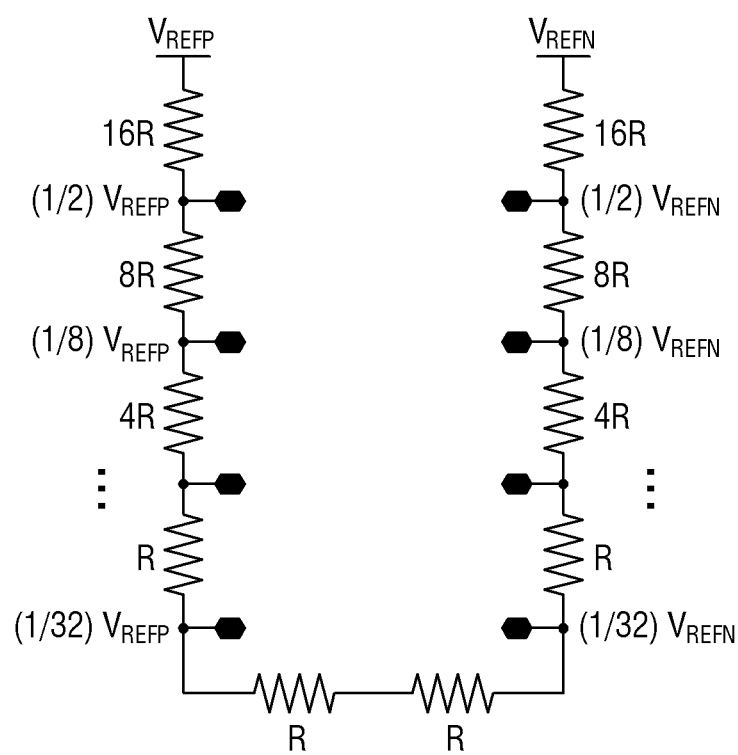
FIG. 3 is a circuit diagram of a differential reference voltage generator of FIG. 2.
Figure 4:
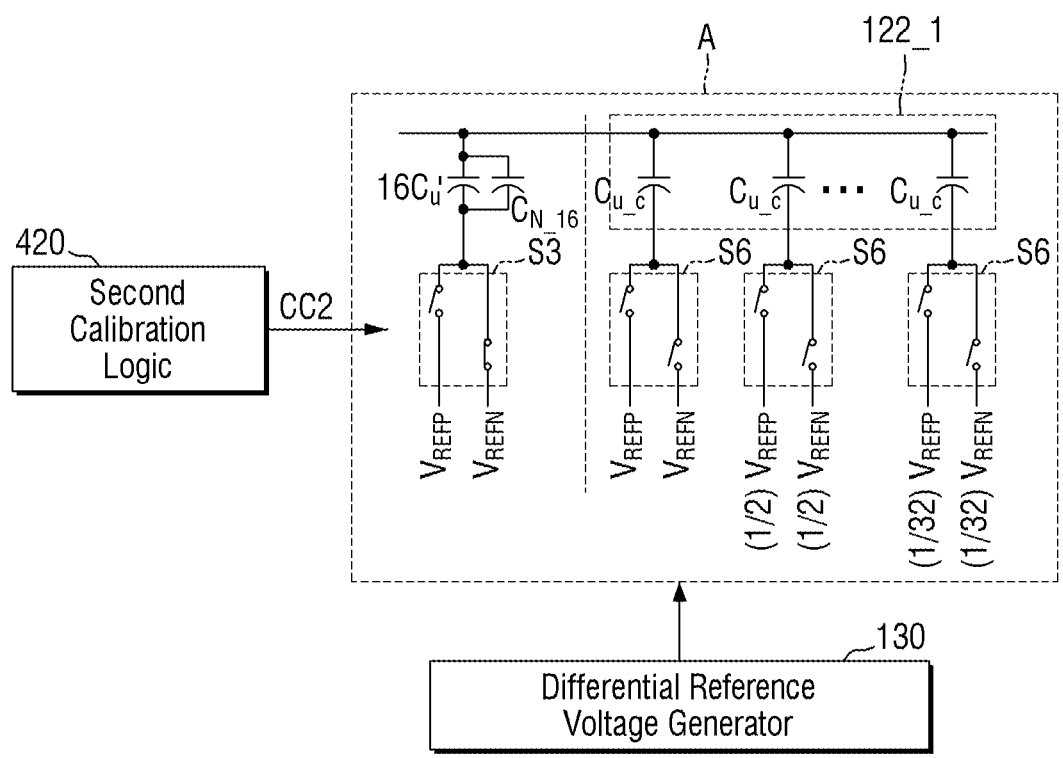
FIG. 4 is an enlarged circuit diagram of part A of FIG. 2.

FIG. 2 is a circuit diagram of the SAR DAC of FIG. 1. FIG. 3 is a circuit diagram of a differential reference voltage generator of FIG. 2. FIG. 4 is an enlarged circuit diagram of part A of FIG. 2.

Referring to FIGS. 1 and 2, the SAR DAC 100 may include the first capacitor array 110, which includes a plurality of capacitors (114 and 117), and the second capacitor array 120, which includes a plurality of capacitors (124 and 127).

Sampling switches S5 may be connected between the first capacitor array 110 and the first node of the comparator 300 and between the second capacitor array 120 and the second node of the comparator 300. First terminals of the capacitors (114 and 117) included in the first capacitor array 110 and first terminals of the capacitors (124 and 127) included in the second capacitor array 120 may be connected to the common mode voltage $V_{CM}$ by the sampling switches S5. The sampling switches S5 may be switched on or off by the first and second switch control signals SC1 and SC2, which are output from the first and second SAR logics 510 and 520, respectively.

The first capacitor array 110 may include a plurality of first upper capacitors 114 and a plurality of first lower capacitors 117. First terminals of the first upper capacitors 114 and first terminals of the first lower capacitors 117 may be connected to the first node of the comparator 300. The second capacitor array 120 may include a plurality of second upper capacitors 124 and a plurality of second lower capacitors 127. First terminals of the second upper capacitors 124 and first terminals of the second lower capacitors 127 may be connected to the second node of the comparator 300.

Second terminals of the first upper capacitors 114 and second terminals of the second upper capacitors 124 may be connected to one of the analog input signal $V_{INN}$, the common mode voltage $V_{CM}$, the first reference voltage $V_{REFP}$, and the second reference voltage $V_{REFN}$ via a plurality of switches (S1, S2, and S3). In some example embodiments, first terminals of capacitors may refer to, for example, top plates of the capacitors, and second terminals of capacitors may refer to, for example, bottom plates of the capacitors.

Second terminals of (1-1)- and (2-1)-th lower capacitors 115 and 125, which are first and second lower capacitors 117 and 127, respectively, may be connected to one of the analog input signal $V_{INN}$, the common mode voltage $V_{CM}$, the first differential reference voltages $(1/2)V_{REFP}$, $(1/4)V_{REFP}$, $(1/8)V_{REFP}$, $(1/16)V_{REFP}$, and $(1/32)V_{REFP}$, and the second differential reference voltages $(1/2)V_{REFN}$, $(1/4)V_{REFN}$, $(1/8)V_{REFN}$, $(1/16)V_{REFN}$, and $(1/32)V_{REFN}$ via a plurality of switches (S1, S2, and S4).

Second terminals of (1-2)-th lower capacitors 116, among the first lower capacitors 117, and second terminals of (2-2)-th lower capacitors 126, among the second lower capacitors 127, may be connected to one of the first differential reference voltages $(1/2)V_{REFP}$, $(1/4)V_{REFP}$, $(1/8)V_{REFP}$, $(1/16)V_{REFP}$, and $(1/32)V_{REFP}$ or one of the second differential reference voltages $(1/2)V_{REFN}$, $(1/4)V_{REFN}$, $(1/8)V_{REFN}$, $(1/16)V_{REFN}$, and $(1/32)V_{REFN}$ via switches S2 and S4. A plurality of switches (S1, S2, S3, and S4) may be switched on or off in accordance with the first calibration signal CS1, the second calibration signal CS2, the first switch control signal SC1, and the second switch control signal SC2, which are output from the first calibration logic 410, the second calibration logic 420, the first SAR logic 510, and the second SAR logic 520, respectively.

The first upper capacitors 114 and the second upper capacitors 124 may have 2n times the capacitance of unit capacitors C. For example, the first upper capacitors 114 and the second upper capacitors 124 may have $2^0$, $2^1$, $2^2$, $2^3$, $2^4$, $2^5$, $2^6$, or $2^7$ times the capacitance of the unit capacitors C. That is, the capacitances of the first upper capacitors 114 and the second upper capacitors 124 may have a binary weight structure.

The first lower capacitors 117 and the second lower capacitors 127 may be the unit capacitors C. A plurality of lower capacitors (117 and 227) may include a plurality of first lower capacitors (115 and 125) and a plurality of second lower capacitors (116 and 126).

The first and second capacitor arrays 110 and 120 may include a plurality of upper capacitors (114 and 124), which are used to determine the upper bits of the digital output signal $D_{OUT}$, and a plurality of lower capacitors (117 and 127), which are used to determine the lower bits of the digital output signal $D_{OUT}$. The upper capacitors (114 and 124) may receive the common mode voltage $V_{CM}$, the first reference voltage $V_{REFP}$, and the second reference voltage $V_{REFN}$ and may thereby be used to determine the upper bits of the digital output signal $D_{OUT}$. The lower capacitors (117 and 127) may receive the common mode voltage $V_{CM}$, the first differential reference voltages $(1/2)V_{REFP}$, $(1/4)V_{REFP}$, $(1/8)V_{REFP}$, $(1/16)V_{REFP}$, and $(1/32)V_{REFP}$, and the second differential reference voltages $(1/2)V_{REFN}$, $(1/4)V_{REFN}$, $(1/8)V_{REFN}$, $(1/16)V_{REFN}$, and $(1/32)V_{REFN}$ and may thereby be used to determine the lower bits of the digital output signal $D_{OUT}$. The digital output signal $D_{OUT}$ will be described later in detail.

For example, there may be provided eight first upper capacitors 114 and eight second upper capacitors 124, and the eight first upper capacitors 114 and the eight second upper capacitors 124 may be used to determine nine bits from the most significant bit (MSB) of the digital output signal $D_{OUT}$. For example, there may be provided five first lower capacitors 117 and five second lower capacitors 127, and the five first lower capacitors 117 and the five second lower capacitors 127 may be used to determine five bits from a lowermost bit of the digital output signal $D_{OUT}$. The semiconductor device 1 will hereinafter be described as being able to output a digital output signal $D_{OUT}$ having nine upper bits and five lower bits, but the present disclosure is not limited thereto.

The first upper capacitors 114 may include a plurality of first variable capacitors 111 that include calibration capacitors and a plurality of first non-variable capacitors 113 that do not include calibration capacitors. The second upper capacitors 124 may include a plurality of second variable capacitors 121 that include calibration capacitors and a plurality of second non-variable capacitors 123 that do not include calibration capacitors.

For example, there may be provided four first variable capacitors 121, four second variable capacitors 124, four first non-variable capacitors 113, and four second non-variable capacitors 123.

Referring to FIGS. 2 and 3, a second variable capacitor $16C_u$ may include a plurality of calibration capacitors 122_1. First terminals of the calibration capacitors 122_1 may be connected to a first terminal of the second variable capacitor $16C_u$. Second terminals of the calibration capacitors 122_1 may be connected to one of the first and second reference voltages $V_{REFP}$ and $V_{REFN}$ via a switch S6 or to one of the first differential reference voltages $(1/2)V_{REFP}$, $(1/4)V_{REFP}$, $(1/8)V_{REFP}$, $(1/16)V_{REFP}$, and $(1/32)V_{REFP}$ or one of the second differential reference voltages $(1/2)V_{REFN}$, $(1/4)V_{REFN}$, $(1/8)V_{REFN}$, $(1/16)V_{REFN}$, and $(1/32)V_{REFN}$. In some example embodiments, the first differential reference voltages $(1/2)V_{REFP}$, $(1/4)V_{REFP}$, $(1/8)V_{REFP}$, $(1/16)V_{REFP}$, and $(1/32)V_{REFP}$ and the second differential reference voltages $(1/2)V_{REFN}$, $(1/4)V_{REFN}$, $(1/8)V_{REFN}$, $(1/16)V_{REFN}$, and $(1/32)V_{REFN}$ may be provided by the differential reference voltage generator 130. The switch S6 may be switched on or off in accordance with the second calibration signal CC2, which is output from the second calibration logic 420.

That is, in some example embodiments, the number of calibration capacitors 122_1 may be greater than the number of first differential reference voltages $(1/2)V_{REFP}$, $(1/4)V_{REFP}$, $(1/8)V_{REFP}$, $(1/16)V_{REFP}$, and $(1/32)V_{REFP}$ by one.

The calibration capacitors 122_1 may have the capacitance of the unit capacitors C.

The capacitance of the second variable capacitor $16C_u$ may be calibrated by providing a calibration voltage to the calibration capacitors 122_1. The capacitance of the second variable capacitor $16C_u$ may be calibrated by calibration capacitors 122_1 that are connected to one of the first reference voltage $V_{REFP}$, the second reference voltage $V_{REFN}$, the first differential reference voltages $(1/2)V_{REFP}$, $(1/4)V_{REFP}$, $(1/8)V_{REFP}$, $(1/16)V_{REFP}$, and $(1/32)V_{REFP}$, and the second differential reference voltages $(1/2)V_{REFN}$, $(1/4)V_{REFN}$, $(1/8)V_{REFN}$, $(1/16)V_{REFN}$, and $(1/32)V_{REFN}$ via switches S6. That is, the calibration voltage may be one of the first differential reference voltages $(1/2)V_{REFP}$, $(1/4)V_{REFP}$, $(1/8)V_{REFP}$, $(1/16)V_{REFP}$, and $(1/32)V_{REFP}$ or one of the second differential reference voltages $(1/2)V_{REFN}$, $(1/4)V_{REFN}$, $(1/8)V_{REFN}$, $(1/16)V_{REFN}$, and $(1/32)V_{REFN}$. The calibration of capacitance will be described later in detail.

Referring to FIGS. 2 and 3, the differential reference voltage generator 130 may include a plurality of resistors (R, 2R, 4R, 8R, and 16R). The resistors (R, 2R, 4R, 8R, and 16R) may be connected in series between a node to which the first reference voltage $V_{REFP}$ is provided and a node to which the second reference voltage $V_{REFN}$ is provided. At least some of the resistors (R, 2R, 4R, 8R, and 16R) may have the same size, and the other resistors may have different sizes. For example, the resistors (R, 2R, 4R, 8R, and 16R) may include resistors R having a first size, resistors 2R having a second size, resistors 4R having a third size, resistors 8R having a fourth size, and resistors 16R having a fifth size. The fifth size may be twice the fourth size, the fourth size may be twice the third size, the third size may be twice the second size, and the second size may be twice the first size.

Accordingly, the differential reference voltage generator 130 may generate the first differential reference voltages $(1/2)V_{REFP}$, $(1/4)V_{REFP}$, $(1/8)V_{REFP}$, $(1/16)V_{REFP}$, and $(1/32)V_{REFP}$, which are respectively $2^{-1}$, $2^{-2}$, $2^{-3}$, $2^{-4}$, and $2^{-5}$ times greater than the first reference voltage $V_{REFP}$, and the second differential reference voltages $(1/2)V_{REFN}$, $(1/4)V_{REFN}$, $(1/8)V_{REFN}$, $(1/16)V_{REFN}$, and $(1/32)V_{REFN}$, which are respectively $2^{-1}$, $2^{-2}$, $2^{-3}$, $2^{-4}$, and $2^{-5}$ times greater than the second reference voltage $V_{REFN}$.

Figure 5:
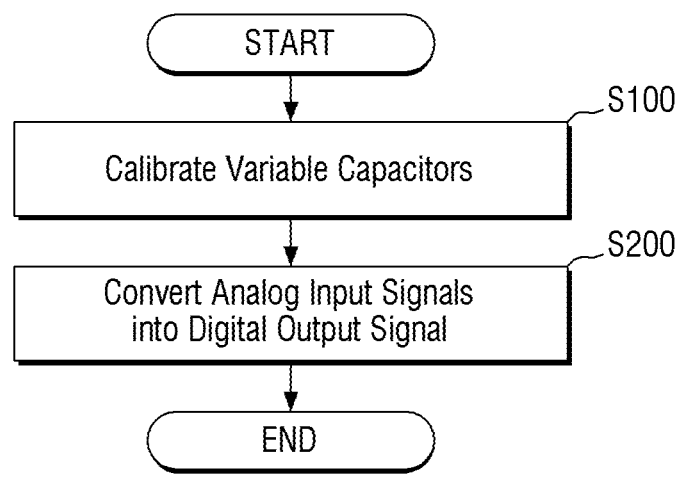
FIG. 5 is a flowchart illustrating an operating method of a semiconductor device according to some example embodiments of the present disclosure.

FIG. 5 is a flowchart illustrating an operating method of a semiconductor device according to some example embodiments of the present disclosure.

Referring to FIGS. 2 and 5, the semiconductor device 1 may calibrate the first variable capacitors 111, among the first upper capacitors 114, and may calibrate the second variable capacitors 121, among the second upper capacitors 124 (S100).

Thereafter, the semiconductor device 1 may convert the analog input signals $V_{INP}$ and $V_{INN}$ into the digital output signal $D_{OUT}$ (S200).

Figure 6:
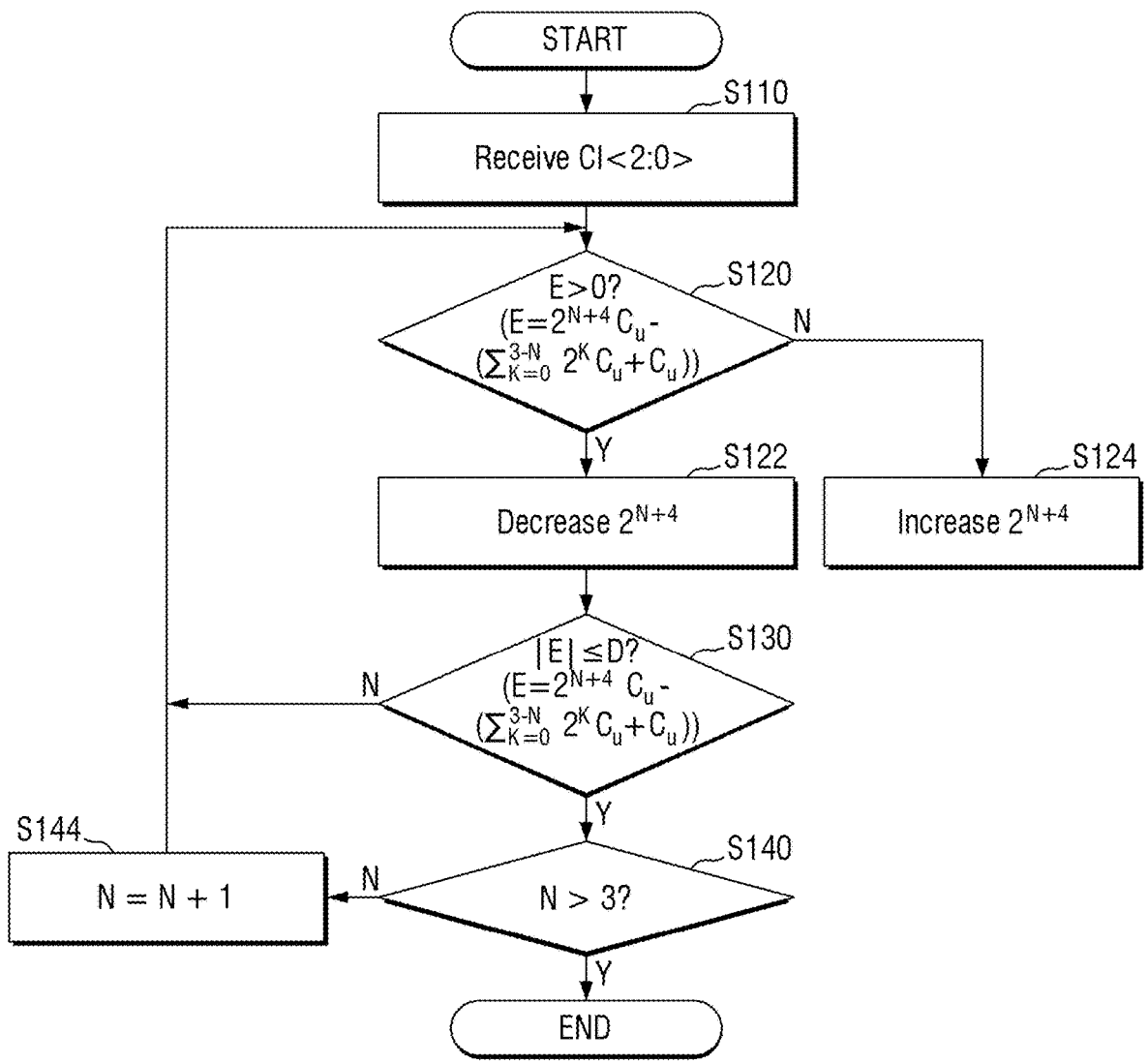
FIG. 6 is a flowchart illustrating S100 of FIG. 5.

FIG. 6 is a flowchart illustrating S100 of FIG. 5. FIGS. 7 through 12 are schematic views illustrating S100 of FIG. 5.

Referring to FIGS. 1, 2, and 6, each of the first and second calibration logics 410 and 420 may receive, from the control logic 600, a selection signal CI<2:0> that selects one of the first variable capacitors 111 or one of the second variable capacitors 121 (S110). The first and second calibration logics 410 and 420 may output the first and second calibration signals CC1 and CC2, respectively, that control the switches (S1, S2, S3, and S4) and the sampling switches S5 in accordance with the selection signal CI<2:0>.

Figure 7:
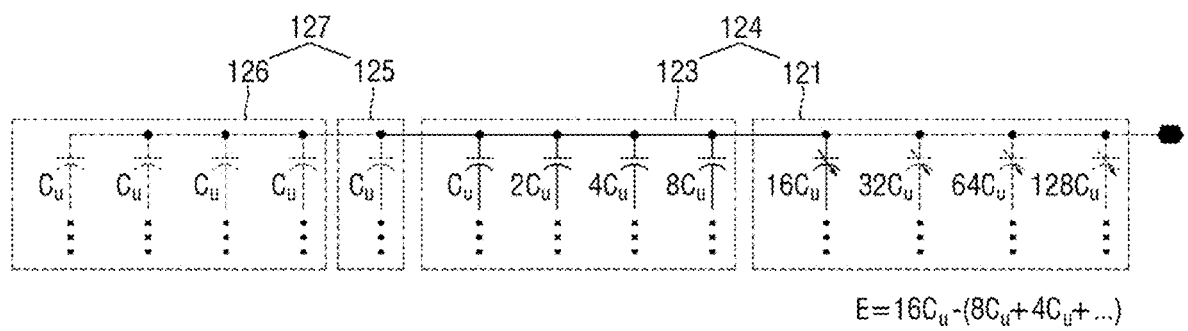
FIGS. 7 through 12 are schematic views illustrating S100 of FIG. 5.

Referring to FIG. 7, it is assumed that a second variable capacitor 16C$_u$ is selected. Thereafter, a determination is made as to whether a difference E between the capacitance of the second variable capacitor 16C$_u$ and the sum of the capacitances of the second non-variable capacitors 123 and the (2-1)-th lower capacitor 125 is greater than zero (S120). The difference E is defined by Equation (1):

$$E = 2^{(N+4)}C_u - (\Sigma_{K=0}^{3-N} 2^K C_u + C_u) \quad (1).$$

That is, when a first or second variable capacitor 16C$_u$ is selected by the selection signal CI<2:0>, N=0. When a first or second variable capacitor 32C$_u$ is selected by the selection signal CI<2:0>, N=1. When a first or second variable capacitor 64C$_u$ is selected by the selection signal CI<2:0>, N=2. When a first or second variable capacitor 128C$_u$ is selected by the selection signal CI<2:0>, N=3.

Figure 8:
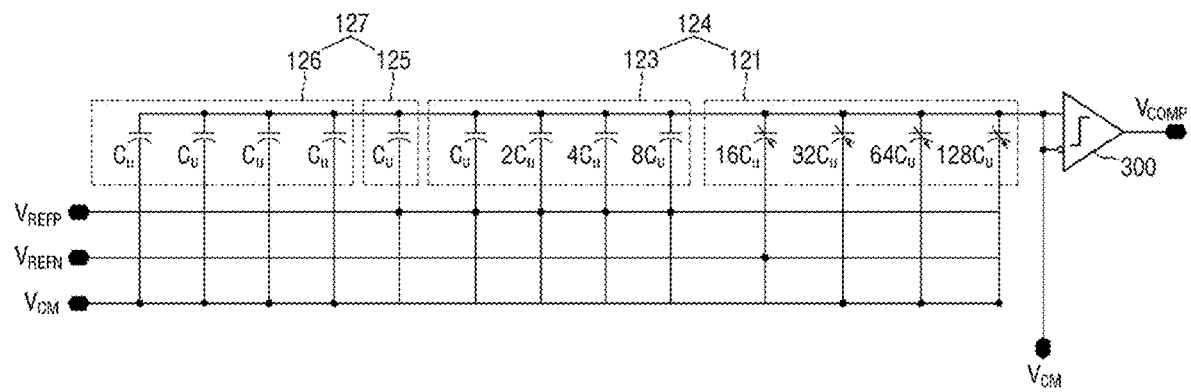

Referring to FIG. 8, the first and second reference voltages $V_{REFP}$ and $V_{REFN}$ may be sampled and held. The first and second reference voltages $V_{REFP}$ and $V_{REFN}$ may be sampled and held by the second variable capacitor 16C$_u$, the second non-variable capacitors 123, and the (2-1)-th lower capacitor 125.

The common mode voltage $V_{CM}$ may be connected to the first terminals of the second variable capacitor 16C$_u$, the second non-variable capacitors 123, and the (2-1)-th lower capacitor 125. The second reference voltage $V_{REFN}$ may be connected to the second terminal of the second variable capacitor 16C$_u$. The first reference voltage $V_{REFP}$ may be connected to the second terminals of the second non-variable capacitors 123 and the (2-1)-th lower capacitor 125.

The common mode voltage $V_{CM}$ may be connected to the first terminals and the second terminals of other non-selected second variable capacitors 32C$_u$, 64C$_u$, and 128C$_u$, and the first terminals and the second terminals of the (2-2)-th lower capacitors 126. That is, the non-selected second variable capacitors 32C$_u$, 64C$_u$, and 128C$_u$ and the (2-2)-th lower capacitors 126 may be in a reset state.

Figure 9:
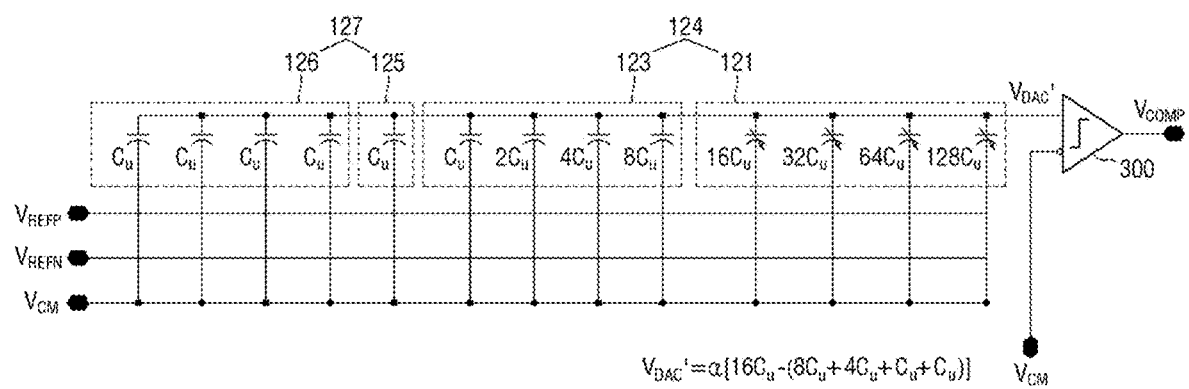

Thereafter, referring to FIG. 9, the common mode voltage $V_{CM}$ may be disconnected from the first terminals of the second variable capacitor 16C$_u$, the second non-variable capacitors 123, and the (2-1)-th lower capacitor 125. The common mode voltage $V_{CM}$ may be connected to the second terminals of the second variable capacitor 16C$_u$, the second non-variable capacitors 123, and the (2-1)-th lower capacitor 125. Accordingly, the comparator 300 may compare a first output voltage $V_{DAC'}$ of the second capacitor array 120 with the common mode voltage $V_{CM}$.

The first output voltage $V_{DAC'}$ may be defined by Equation (2):

$$V_{DAC'} = \alpha\{16C_u - (8C_u + 4C_u + 2C_u + C_u + C_u)\} \quad (2).$$

The comparator 300 may compare the capacitance of the second variable capacitor 16C$_u$ with the sum of the capacitances of the second non-variable capacitors 123 and the (2-1)-th lower capacitor 125. If the capacitance of the second variable capacitor 16C$_u$ is greater than the sum of the capacitances of the second non-variable capacitors 123 and the (2-1)-th lower capacitor 125, the comparator 300 may output the first-level comparison signal $V_{COMP}$. If the capacitance of the second variable capacitor 16C$_u$ is smaller than the sum of the capacitances of the second non-variable capacitors 123 and the (2-1)-th lower capacitor 125, the comparator 300 may output the second-level comparison signal $V_{COMP}$.

Thereafter, referring to FIG. 6, if a determination is made in S120 that the difference E is greater than zero, the capacitance of the second variable capacitor 16C$_u$ may be reduced (S122). The capacitance of the second variable capacitor 16C$_u$ may be reduced by connecting one of the first reference voltage $V_{REFP}$, the second reference voltage $V_{REFN}$, the first differential reference voltages $(1/2)V_{REFP}$, $(1/4)V_{REFP}$, $(1/8)V_{REFP}$, $(1/16)V_{REFP}$, and $(1/32)V_{REFP}$, and the second differential reference voltages $(1/2)V_{REFN}$, $(1/4)V_{REFN}$, $(1/8)V_{REFN}$, $(1/16)V_{REFN}$, and $(1/32)V_{REFN}$ to the calibration capacitors 122_1 that are connected to the second variable capacitor 16C$_u$.

Figure 10:
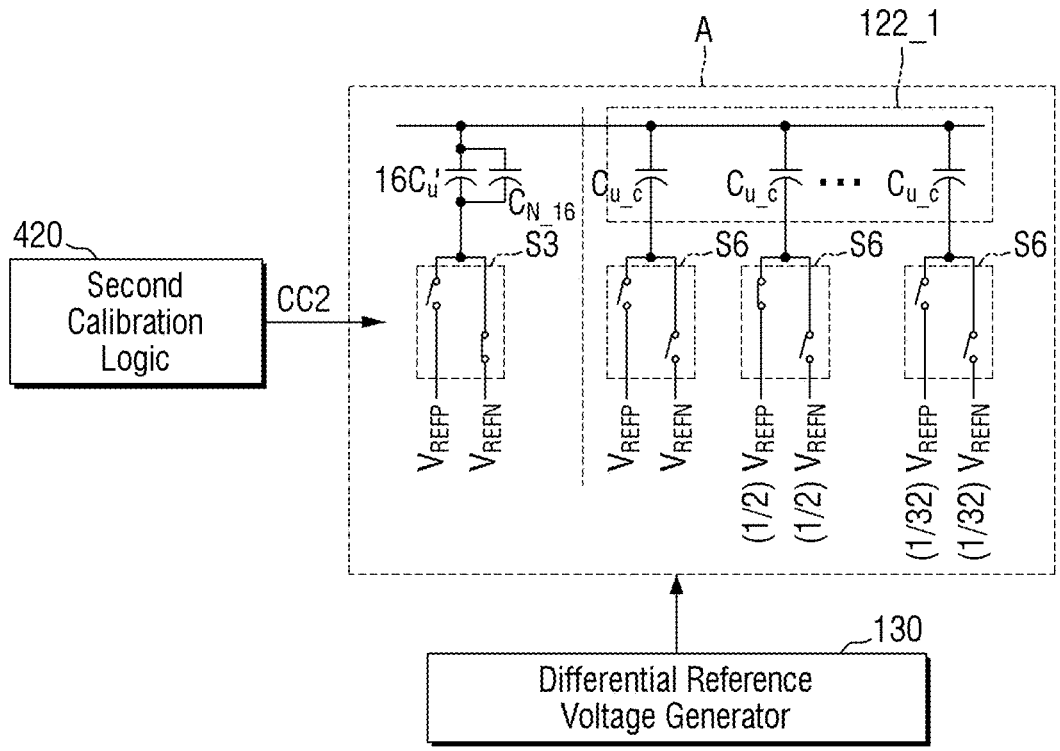

Referring to FIG. 10, the second variable capacitor 16C$_u$ may have, for example, a nonideal capacitance $C_{N\_16}$, which is $(1/2)C_u$. In some example embodiments, when the analog input signals $V_{INP}$ and $V_{INN}$ are converted into a digital output signal $D_{OUT}$, the first differential reference voltage $(1/2)V_{REFP}$ may be connected to the second terminal of a calibration capacitor $C_{u\_c}$ of the second variable capacitor 16C$_u$ because the second reference voltage $V_{REFN}$ is connected to the second terminal of the second variable capacitor 16C$_u$. Accordingly, the nonideal capacitance $C_{N\_16}$ may be offset by the calibration capacitor $C_{u\_c}$ to which the first differential reference voltage $(1/2)V_{REFP}$ is connected, and the capacitance of the second variable capacitor 16C$_u$, like the capacitance of the second non-variable capacitors 123, may have a binary weight structure.

On the contrary, referring again to FIG. 6, if a determination is made in S120 that the difference E is smaller than or the same as zero, the capacitance of the second variable capacitor 16C$_u$ may be raised (S124). The capacitance of the second variable capacitor 16C$_u$ may be raised by connecting one of the first reference voltage $V_{REFP}$, the second reference voltage $V_{REFN}$, the first differential reference voltages $(1/2)V_{REFP}$, $(1/4)V_{REFP}$, $(1/8)V_{REFP}$, $(1/16)V_{REFP}$, and $(1/32)V_{REFP}$, and the second differential reference voltages $(1/2)V_{REFN}$, $(1/4)V_{REFN}$, $(1/8)V_{REFN}$, $(1/16)V_{REFN}$, and $(1/32)V_{REFN}$ to the calibration capacitors 122_1 that are connected to the second variable capacitor 16$C_u$. For example, when the analog input signals $V_{INP}$ and $V_{INN}$ are converted into a digital output signal $D_{OUT}$, the second differential reference voltage $(1/2)V_{REFN}$ may be connected to the second terminal of a calibration capacitor $C_{u\_c}$ of the second variable capacitor 16$C_u$ because the second reference voltage $V_{REFN}$ is connected to the second terminal of the second variable capacitor 16$C_u$. Accordingly, the nonideal capacitance $C_{N\_16}$ may be offset by the calibration capacitor $C_{u\_c}$ to which the second differential reference voltage $(1/2)V_{REFN}$ is connected, and the capacitance of the second variable capacitor 16$C_u$, like the capacitance of the second non-variable capacitors 123, may have a binary weight structure.

Thereafter, referring again to FIG. 6, a determination may be made as to whether the absolute value of the difference E is smaller than or the same as a predetermined or alternatively, desired value D (S130). The predetermined or alternatively, desired value D may be a value set in advance in consideration of design margins, parasitic components between adjacent capacitors, and the range of maximum mismatches between capacitors.

If the absolute value of the difference E is smaller than or the same as the predetermined or alternatively, desired value D, a determination may be made as to whether N>3 (S140).

If a determination is made in S140 that N>3, the operating method may end.

On the contrary, if a determination is made in S140 that N≤3, N may be raised by 1 (S144), and the operating method may return to S120. That is, calibration may be performed on the capacitors included in the first capacitor array 110, ranging from the first variable capacitor 16$C_u$ to the first variable capacitor 128$C_u$, and on the capacitors included in the second capacitor array 120, ranging from the second variable capacitor 16$C_u$ to the second variable capacitor 128$C_u$.

Figure 12:
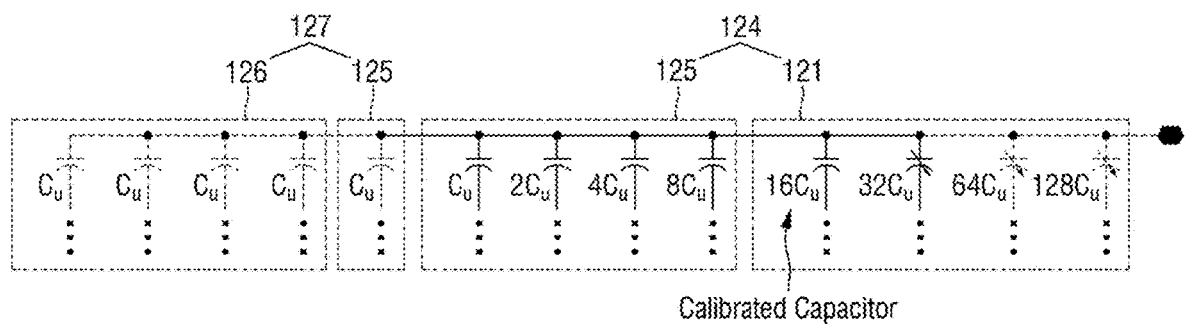

Referring to FIG. 12, if the second variable capacitor 16$C_u$ is calibrated, N may be raised by 1 so that the second variable capacitor 32$C_u$ may be calibrated. Then, the operating method returns to S120, and a determination may be made as to whether a difference E between the capacitance of the second variable capacitor 32$C_u$ and the sum of the capacitances of the capacitance of the calibrated second variable capacitor 32$C_u$, the second variable capacitor 16$C_u$, the second non-variable capacitors 123, and the (2-1)-th lower capacitor 125 is greater than zero.

On the contrary, referring again to FIG. 6, if a determination is made in S130 that the difference E is greater than the predetermined or alternatively, desired value D, the operating method may return to S120. As a result, the calibration capacitors $C_{u\_c}$ included in each of the first variable capacitors 111 and the calibration capacitors $C_{u\_c}$ included in each of the second variable capacitors 121 may be connected to different differential reference voltages. Also, the number of calibration capacitors $C_{u\_c}$ connected to a differential reference voltage may differ from one first variable capacitor 111 to another first variable capacitor 111 or from one second variable capacitor 121 to another second variable capacitor 121.

Figure 11:
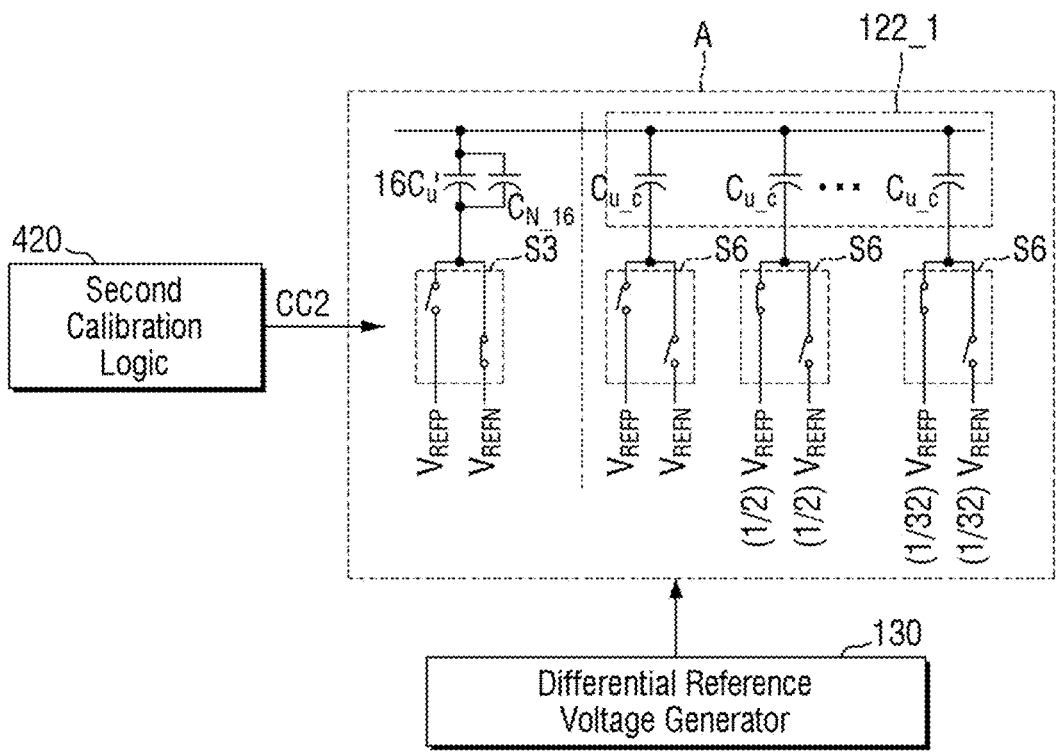

Referring to FIG. 11, the second variable capacitor 16$C_u$ may have a nonideal capacitance $C_{N\_16}$, which is $(1/2)C_u + (1/32)C_u$. In some example embodiments, the operating method may return to S120 with the first differential reference voltage $(1/2)V_{REFP}$ connected to a correction capacitor $C_{u\_c}$ of the second variable capacitor 16$C_u$, and the first differential reference voltage $(1/32)V_{REFP}$ may be connected to another correction capacitor $C_{u\_c}$ of the second variable capacitor 16$C_u$. Alternatively, the operating method may return to S120 with the first differential reference voltage $(1/32)V_{REFP}$ connected to a correction capacitor $C_{u\_c}$ of the second variable capacitor 16$C_u$, and the first differential reference voltage $(1/2)V_{REFP}$ may be connected to another correction capacitor $C_{u\_c}$ of the second variable capacitor 16$C_u$. Accordingly, the nonideal capacitance $C_{N\_16}$ may be offset by the calibration capacitor $C_{u\_c}$ to which the first differential reference voltage $(1/2)V_{REFP}$ is connected and the calibration capacitor $C_{u\_c}$ to which the first differential reference voltage $(1/32)V_{REFP}$ is connected, and the capacitance of the second variable capacitor 16$C_u$, like the capacitance of the second non-variable capacitors 123, may have a binary weight structure.

Capacitors with a relatively large capacitance may have a structure in which a plurality of unit capacitors are connected. However, mismatches may occur due to the parasitic components of metals that connect the plurality of unit capacitors, and as a result, the linearity of each capacitor included in a capacitor array may deteriorate.

In example embodiments of the semiconductor device 1, the first variable capacitors 111, which have the largest capacitance in the first capacitor array 110, and the second variable capacitors 121, which have the largest capacitance in the second capacitor array 120, may be calibrated. Accordingly, as the first variable capacitors 111, which affect the linearity of the first capacitor array 110 the most, and the second variable capacitors 121, which affect the linearity of the second capacitor array 120 the most, are calibrated, the linearity of the first and second capacitor arrays 110 and 120 can be improved.

Also, as the semiconductor device 1 converts the analog input signals $V_{INP}$ and $V_{INN}$ into the digital output signal $D_{OUT}$ with the use of the first and second capacitor arrays 110 and 120, the precision of the semiconductor device 1 can be improved.

The first variable capacitors 111 and the second variable capacitors 112 may be calibrated using the calibration capacitors 122_1 and using the first differential reference voltages $(1/2)V_{REFP}$, $(1/4)V_{REFP}$, $(1/8)V_{REFP}$, $(1/16)V_{REFP}$, and $(1/32)V_{REFP}$ and the second differential reference voltages $(1/2)V_{REFN}$, $(1/4)V_{REFN}$, $(1/8)V_{REFN}$, $(1/16)V_{REFN}$, and $(1/32)V_{REFN}$. The calibration capacitors 122_1 may have unit capacitance. Thus, the semiconductor device 1 does not require custom capacitors with a capacitance lower than the unit capacitance, and a separate voltage generator for calibrating the first variable capacitors 111 and the second variable capacitors 121 is not needed because the first differential reference voltages $(1/2)V_{REFP}$, $(1/4)V_{REFP}$, $(1/8)V_{REFP}$, $(1/16)V_{REFP}$, and $(1/32)V_{REFP}$ and the second differential reference voltages $(1/2)V_{REFN}$, $(1/4)V_{REFN}$, $(1/8)V_{REFN}$, $(1/16)V_{REFN}$, and $(1/32)V_{REFN}$ can be used to convert the analog input signals $V_{INP}$ and $V_{INN}$ into the digital output signal $D_{OUT}$. Therefore, the circuit complexity of the semiconductor device 1 can be reduced. Also, as the calibration capacitors 122_1 can be arranged together with the first and second capacitor arrays 110 and 120, the area of the semiconductor device 1 can be reduced.

Figure 13:
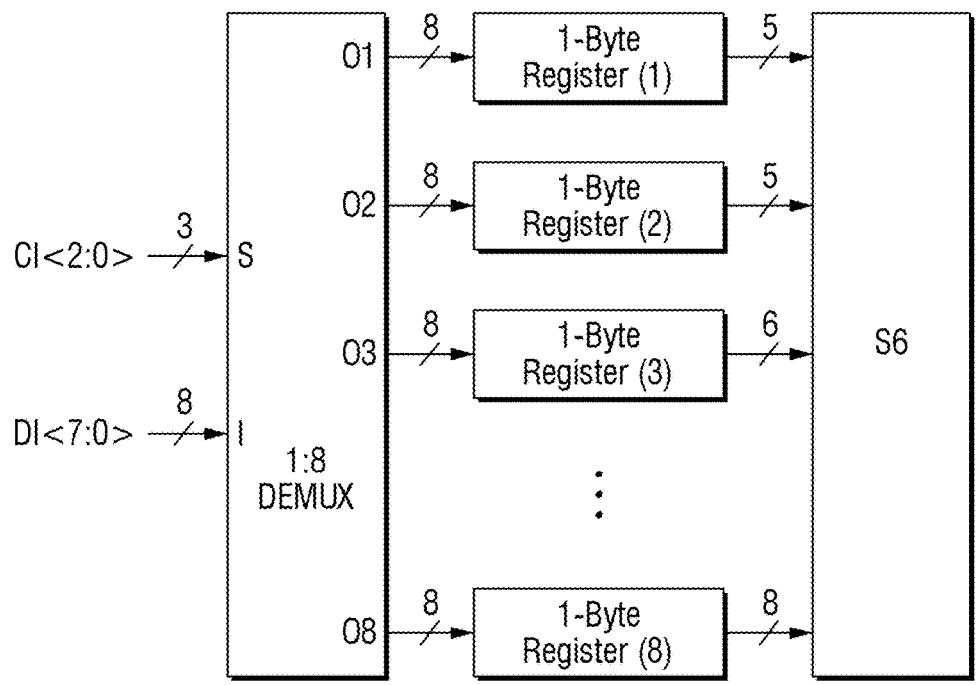
FIG. 13 is a circuit diagram of the first calibration logic of FIG. 2.

FIG. 13 is a circuit diagram of the first calibration logic of FIG. 2.

Referring to FIG. 13, the first calibration logic 410 may include a demultiplexer "1:8 DEMUX" and registers "1-Byte Register". The first calibration logic 410 may receive the selection signal CI<2:0>, which selects a target capacitor to be calibrated from among the first variable capacitors 111 and the second variable capacitors 121, and a calibration signal DI<7:0>, which selects one of the first differential reference voltages $(1/2)V_{REFP}$, $(1/4)V_{REFP}$, $(1/8)V_{REFP}$, $(1/16)V_{REFP}$, and $(1/32)V_{REFP}$ or one of the second differential reference voltages $(1/2)V_{REFN}$, $(1/4)V_{REFN}$, $(1/8)V_{REFN}$, $(1/16)V_{REFN}$, and $(1/32)V_{REFN}$.

The selection signal CI<2:0> may be a 3-bit digital code. One of the first variable capacitors 111 or the second variable capacitors 121 may be selected by the selection signal CI<2:0>.

The calibration signal DI<7:0> may be an 8-bit digital code. Switches S6 connected to calibration capacitors 122_1 of a variable capacitor selected by the selection signal CI<2:0> may be controlled by the calibration signal DI<7:0>. As a result, the first differential reference voltages $(1/2)V_{REFP}$, $(1/4)V_{REFP}$, $(1/8)V_{REFP}$, $(1/16)V_{REFP}$, and $(1/32)V_{REFP}$ and the second differential reference voltages $(1/2)V_{REFN}$, $(1/4)V_{REFN}$, $(1/8)V_{REFN}$, $(1/16)V_{REFN}$, and $(1/32)V_{REFN}$ may be connected to the calibration capacitors 122_1 of the variable capacitor selected by the selection signal CI<2:0>.

Figure 14:
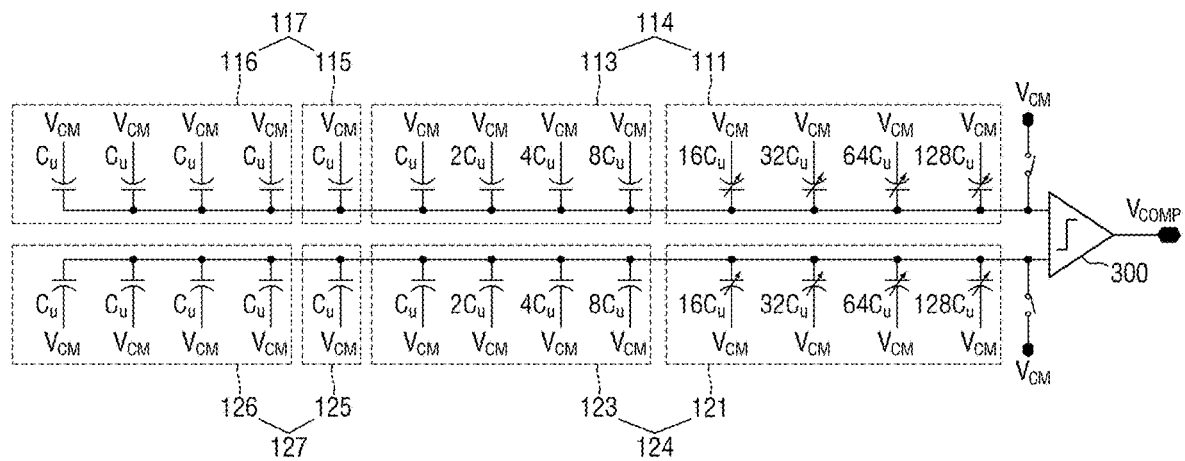
FIGS. 14 and 15 are schematic views of an operation of the semiconductor device of FIG. 1.
Figure 15:
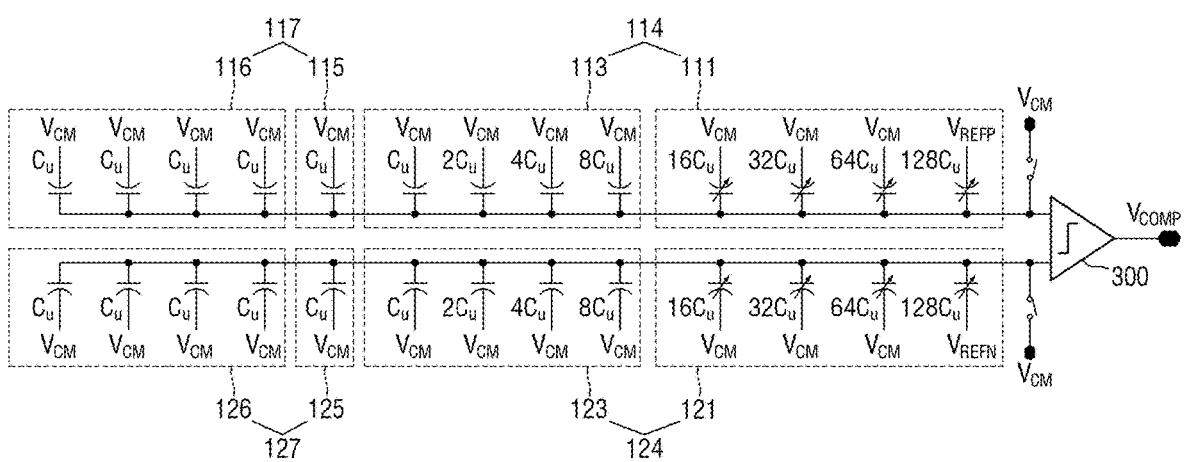

FIGS. 14 and 15 are schematic views of an operation of the semiconductor device of FIG. 1.

Referring again to FIG. 2, the semiconductor device 1 may sample and hold the analog input signals $V_{INP}$ and $V_{INN}$. For example, the common mode voltage $V_{CM}$ may be connected to the first terminals of each of the first and second capacitor arrays 110 and 120.

The analog input signal $V_{INP}$ may be connected to the second terminals of the first upper capacitors 114 and the (1-1)-th lower capacitor 115 of the first capacitor array 110. The common mode voltage $V_{CM}$ may be connected to the second terminals of the (1-2)-th lower capacitors 116 of the first capacitor array 110.

The analog input signal $V_{INN}$ may be connected to the second terminals of the first upper capacitors 124 and the (2-1)-th lower capacitor 125 of the second capacitor array 120. The common mode voltage $V_{CM}$ may be connected to the second terminals of the (2-2)-th lower capacitors 126 of the second capacitor array 120.

Accordingly, the analog input signals $V_{INP}$ and $V_{INN}$ can be stored by the capacitors of the first or second capacitor array 110 and 120.

Thereafter, referring to FIG. 14, the common mode voltage $V_{CM}$ may be disconnected from the first terminals of each of the first and second capacitor arrays 110 and 120. The common mode voltage $V_{CM}$ may be connected to the second terminals of each of the first and second capacitor arrays 110 and 120. The comparator 300 may compare the output of the first capacitor array 110 with the output of the second capacitor array 120. The MSBs of the analog input signals $V_{INP}$ and $V_{INN}$ may be determined by the comparison signal $V_{COMP}$ from the comparator 300.

Thereafter, referring to FIG. 15, the first reference voltage $V_{REFP}$ may be connected to the second terminal of a first variable capacitor $128C_u$, and the second reference voltage $V_{REFN}$ may be connected to the second terminal of a second variable capacitor $128C_u$. The upper bits of each of the analog input signals $V_{INP}$ and $V_{INN}$ may be determined by the comparison signal $V_{COMP}$ from the comparator 300. By repeating this operation, the upper bits of the digital output signal $D_{OUT}$ corresponding to the analog input signals $V_{INP}$ and $V_{INN}$ may be determined.

The lower bits of the digital output signal $D_{OUT}$ may be determined by the first lower capacitors 117 to which the first differential reference voltages $(1/2)V_{REFP}$, $(1/4)V_{REFP}$, $(1/8)V_{REFP}$, $(1/16)V_{REFP}$, and $(1/32)V_{REFP}$ are connected and the second lower capacitors 127 to which the second differential reference voltages $(1/2)V_{REFN}$, $(1/4)V_{REFN}$, $(1/8)V_{REFN}$, $(1/16)V_{REFN}$, and $(1/32)V_{REFN}$ are connected. For example, the number of first lower capacitors 117 may be the same as the number of first differential reference voltages $(1/2)V_{REFP}$, $(1/4)V_{REFP}$, $(1/8)V_{REFP}$, $(1/16)V_{REFP}$, and $(1/32)V_{REFP}$, and the number of second lower capacitors 127 may be the same as the number of second differential reference voltages $(1/2)V_{REFN}$, $(1/4)V_{REFN}$, $(1/8)V_{REFN}$, $(1/16)V_{REFN}$, and $(1/32)V_{REFN}$.

That is, the semiconductor device 1 can determine the lower bits of the digital output signal $D_{OUT}$ using the first differential reference voltages $(1/2)V_{REFP}$, $(1/4)V_{REFP}$, $(1/8)V_{REFP}$, $(1/16)V_{REFP}$, and $(1/32)V_{REFP}$ and the second lower capacitors 127 may be the same as the number of second differential reference voltages $(1/2)V_{REFN}$, $(1/4)V_{REFN}$, $(1/8)V_{REFN}$, $(1/16)V_{REFN}$, and $(1/32)V_{REFN}$. Thus, as the semiconductor device 1 does not require custom capacitors with a capacitance lower than unit capacitance, the circuit complexity of the semiconductor device 1 can be reduced.

Figure 16:
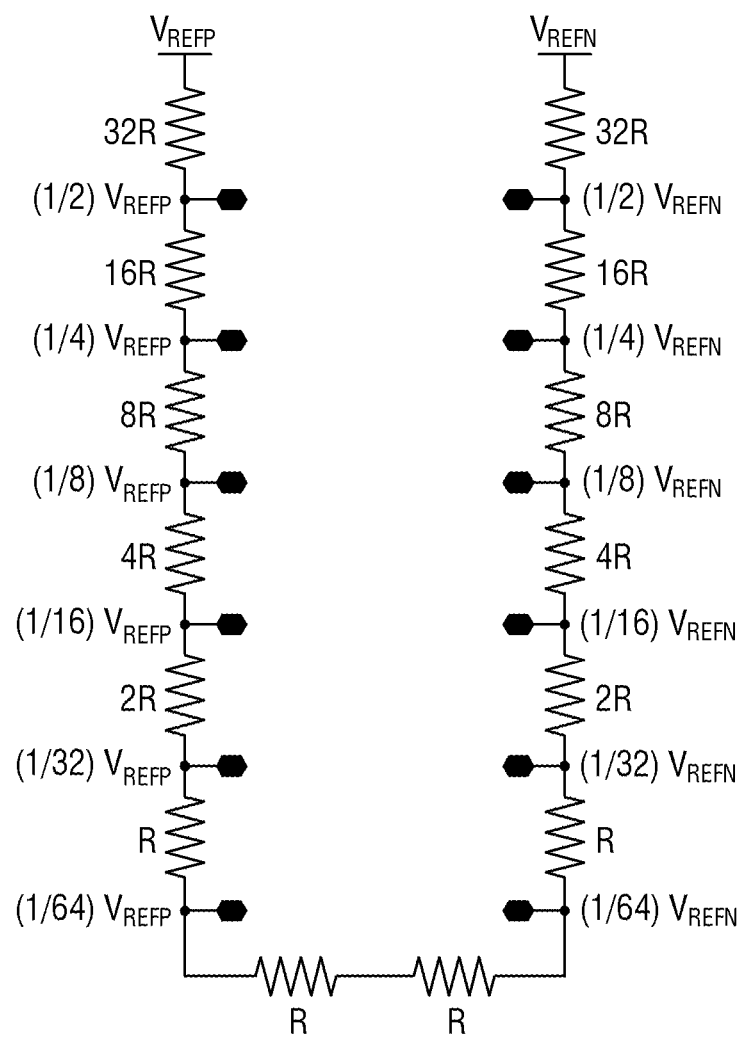
FIG. 16 is a circuit diagram of the differential reference voltage generator of FIG. 2.
Figure 17:
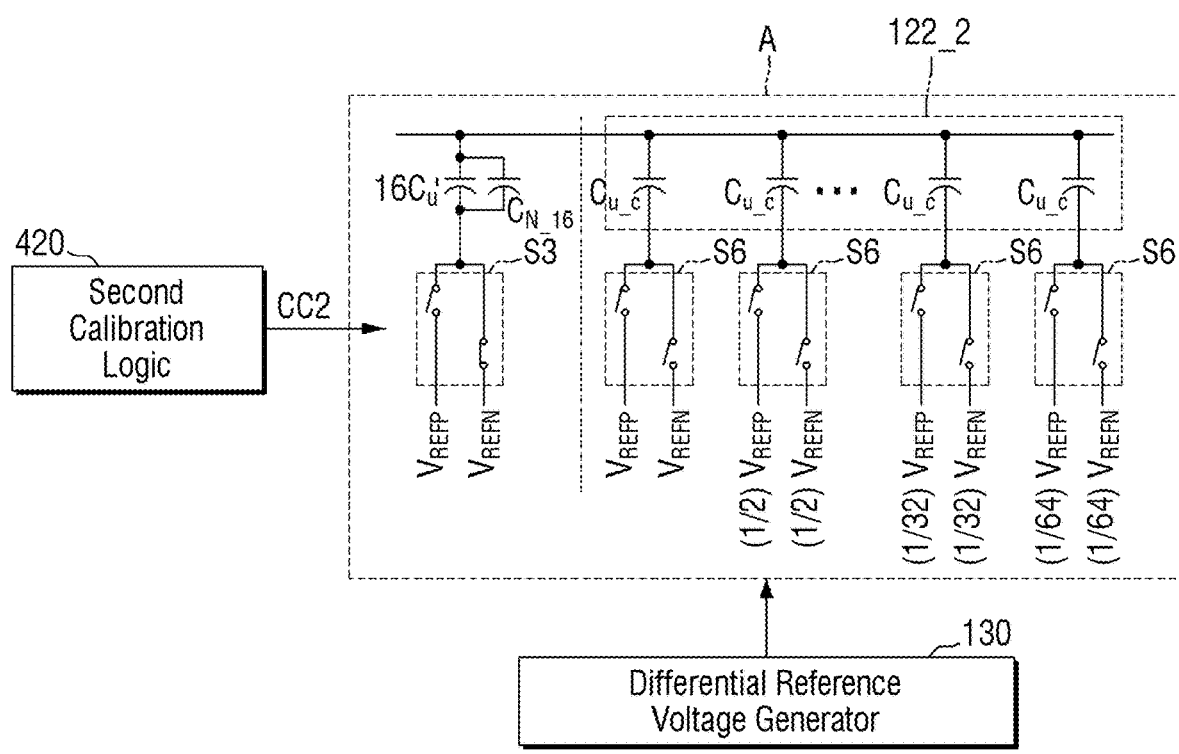
FIG. 17 is an enlarged circuit diagram of part A of FIG. 2.

FIG. 16 is a circuit diagram of the differential reference voltage generator of FIG. 2. FIG. 17 is an enlarged circuit diagram of part A of FIG. 2. FIG. 17 is an enlarged circuit diagram of part A of FIG. 2 when the differential reference voltage generator of FIG. 2 is as illustrated in FIG. 16. For convenience, the example embodiments of FIGS. 16 and 17 will hereinafter be described, focusing mainly on the differences with the example embodiments of FIGS. 3 and 4.

Referring to FIG. 16, a differential reference voltage generator 130_2 may further include resistors 32R having a sixth size. The sixth size may be twice the fifth size. Accordingly, the differential reference voltage generator 130_2 can generate a first differential reference voltage $(1/64)V_{REFP}$, which is $2^{-6}$ times the first reference voltage $V_{REFP}$, and a second differential reference voltage $(1/64)V_{REFN}$, which is $2^{-6}$ times the second reference voltage $V_{REFN}$.

Referring to FIGS. 2 and 17, the second variable capacitor $16C_u$ may further include a calibration capacitor $C_{u\_c}$ which is selectively connected to the first and second differential reference voltages $(1/64)V_{REFP}$ and $(1/64)V_{REFN}$. Thus, the second variable capacitor $16C_u$ can be selectively connected to a relatively large number of first differential reference voltages $(1/2)V_{REFP}$, $(1/4)V_{REFP}$, $(1/8)V_{REFP}$, $(1/16)V_{REFP}$, $(1/32)V_{REFP}$, and $(1/64)V_{REFP}$ and a relatively large number of second lower capacitors 127 may be the same as the number of second differential reference voltages $(1/2)V_{REFN}$, $(1/4)V_{REFN}$, $(1/8)V_{REFN}$, $(1/16)V_{REFN}$, $(1/32)V_{REFN}$, and $(1/64)V_{REFN}$, and the capacitance of the second variable capacitor $16C_u$ can be precisely calibrated.

Referring to FIGS. 2 and 16, the number of first differential reference voltages $(1/2)V_{REFP}$, $(1/4)V_{REFP}$, $(1/8)V_{REFP}$, $(1/16)V_{REFP}$, $(1/32)V_{REFP}$, and $(1/64)V_{REFP}$ and the number of second differential reference voltages $(1/2)V_{REFN}$, $(1/4)V_{REFN}$, $(1/8)V_{REFN}$, $(1/16)V_{REFN}$, $(1/32)V_{REFN}$, and $(1/64)V_{REFN}$ may differ from the number of first lower capacitors 117 and the number of second lower capacitors 127. The number of first differential reference voltages $(1/2)V_{REFP}$, $(1/4)V_{REFP}$, $(1/8)V_{REFP}$, $(1/16)V_{REFP}$, $(1/32)V_{REFP}$, and $(1/64)V_{REFP}$ may be greater than the number of first lower capacitors 117, and the number of second differential reference voltages $(1/2)V_{REFN}$, $(1/4)V_{REFN}$, $(1/8)V_{REFN}$, $(1/16)V_{REFN}$, $(1/32)V_{REFN}$, and $(1/64)$ $V_{REFN}$ may be greater than the number of second lower capacitors 127. The first lower capacitors 117 and the second lower capacitors 127 can be used to determine the lower bits of the digital output signal $D_{OUT}$ together with some of the first differential reference voltages $(1/2)V_{REFP}$, $(1/4)V_{REFP}$, $(1/8)V_{REFP}$, $(1/16)V_{REFP}$, $(1/32)V_{REFP}$, and $(1/64)V_{REFP}$ and some of the second differential reference voltages $(1/2)V_{REFN}$, $(1/4)V_{REFN}$, $(1/8)V_{REFN}$, $(1/16)V_{REFN}$, $(1/32)V_{REFN}$, and $(1/64)V_{REFN}$.

Figure 18:
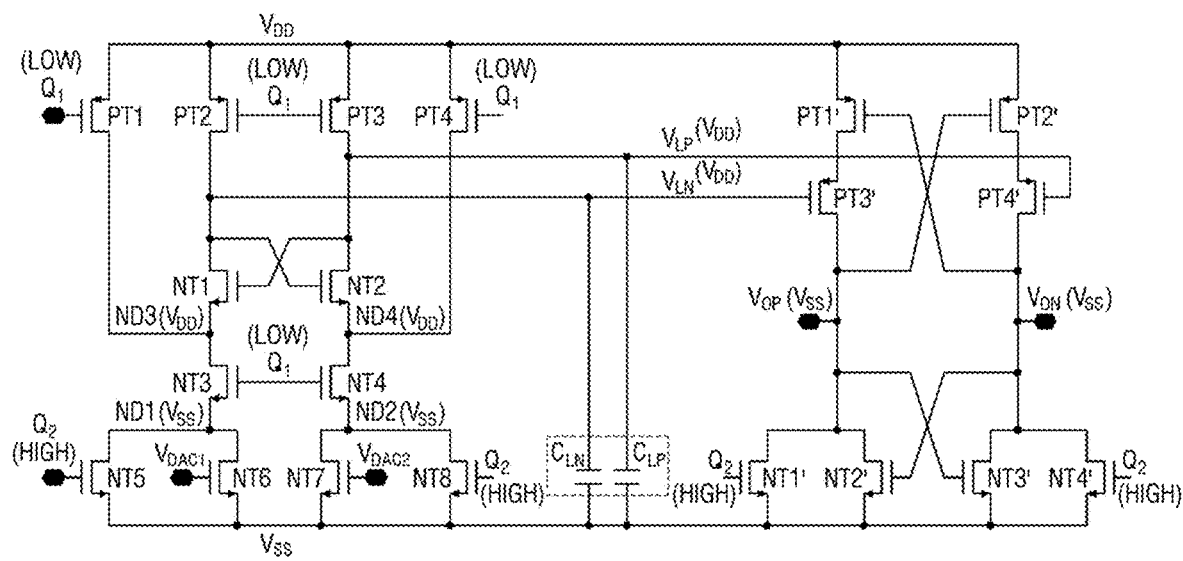
FIGS. 18 through 20 are circuit diagrams illustrating operations of the comparator of FIG. 2.
Figure 19:
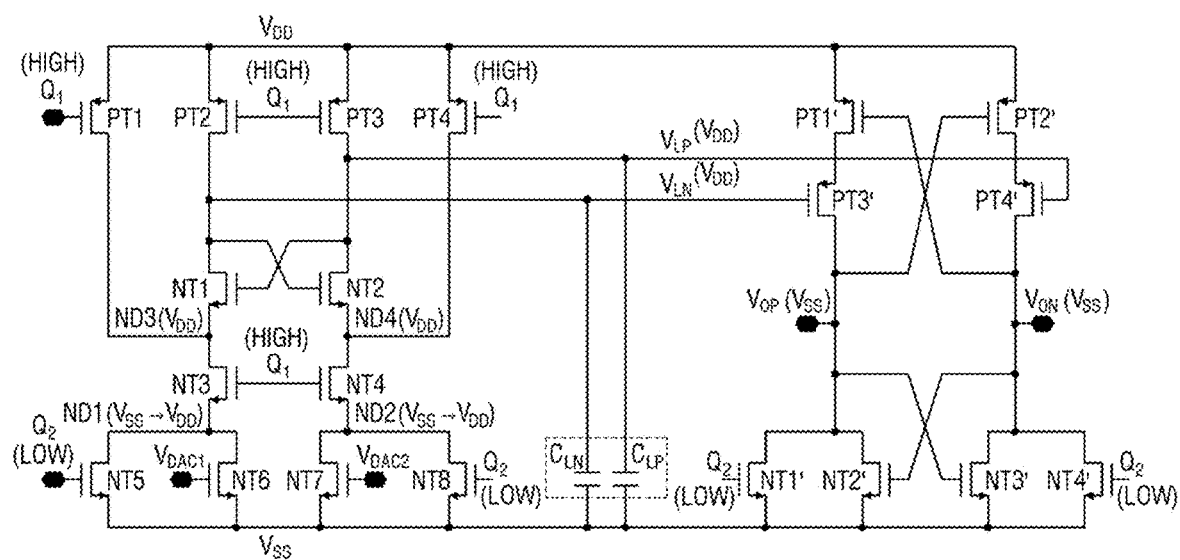
Figure 20:
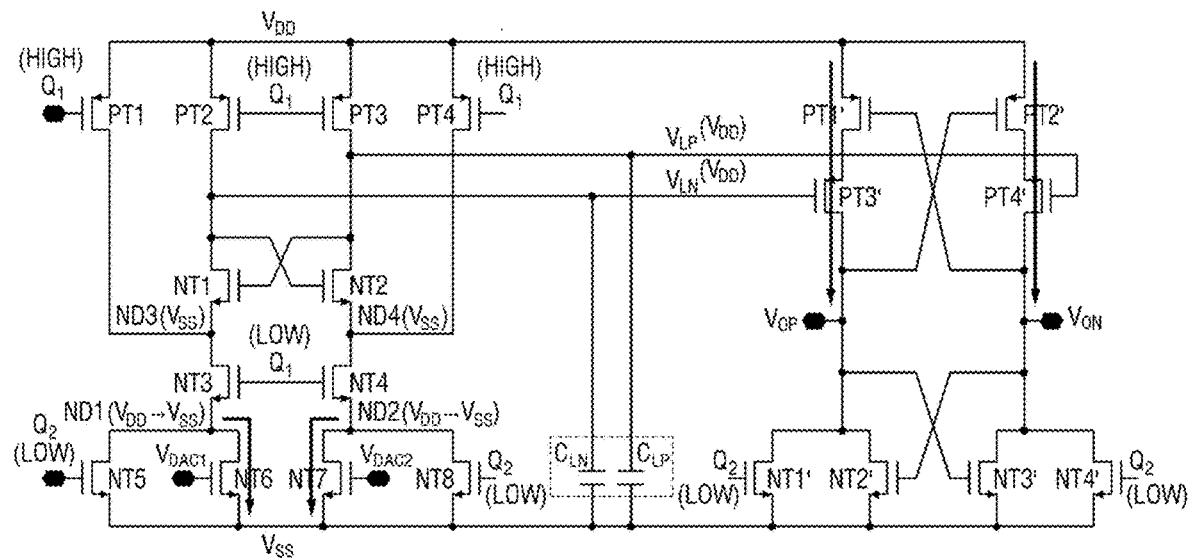

FIGS. 18 through 20 are circuit diagrams illustrating operations of the comparator of FIG. 2.

Referring to FIGS. 2 and 18, the comparator 300 may have a two-stage latch structure in which two latches are connected by noise reduction capacitors $C_{LN}$ and $C_{LP}$. The noise reduction capacitors $C_{LN}$ and $C_{LP}$ may be connected between output nodes $V_{LP}$ and $V_{LN}$ of a first latch and a second voltage $V_{SS}$. The noise reduction capacitors $C_{LN}$ and $C_{LP}$ may attenuate variations in the voltages of the output nodes $V_{LP}$ and $V_{LN}$ of the first latch. As a result, noise of the comparator 300 can be reduced or alleviated.

Clock signals $Q_1$ and $Q_2$ may be clock signals that are complementary to each other. That is, when the clock signal $Q_1$ has the first level, the clock signal $Q_2$ has the second level, and when the clock signal $Q_1$ has the second level, the clock signal $Q_2$ has the first level. For example, the first level may be a high level "HIGH", and the second level may be a low level "LOW".

When the clock signal $Q_2$ has the first level, transistors NT5 and NT8 may be turned on. As a result, a second voltage $V_{SS}$ may be provided to first and second nodes ND1 and ND2. Also, transistors NT1' and NT4' may be turned on. Accordingly, the second voltage $V_{SS}$ may be provided to first and second output nodes $V_{OP}$ and $V_{ON}$ of the second latch. In some example embodiments, as the clock signal $Q_1$ has the second level, transistors PT1, PT2, PT3, and PT4 may be turned on. Thus, a first voltage $V_{DD}$ may be provided to third and fourth nodes ND3 and ND4.

For example, transistors NT1, NT2, NT3, NT4, NT5, NT6, NT7, NT8, NT1', NT2', NT3', and NT4' may be implemented as N-type transistors, and transistors PT1, PT2, PT3, PT4, PT1', PT2', PT3', and PT4' may be implemented as P-type transistors. However, the present disclosure is not limited to this example.

Thereafter, referring to FIG. 19, when the clock signal $Q_1$ has the first level and the clock signal $Q_2$ has the second level, the transistors PT1, PT2, PT3, PT4, NT5, and NT8 may be turned off, and the transistors NT3 and NT4 may be turned on. As a result, the first voltage $V_{DD}$ may be provided from the first node ND1 to the first node ND3 and from the second node ND2 to the fourth node ND4.

Thereafter, referring to FIG. 20, the first output voltage $V_{DAC1}$ of the first capacitor array 110 and the second output voltage $V_{DAC2}$ of the second capacitor array 120 may be input. The transistor NT6 may be turned on by the first output voltage $V_{DAC1}$, and the transistor NT7 may be turned on by the second output voltage $V_{DAC2}$. If the first output voltage $V_{DAC1}$ is higher than the second output voltage $V_{DAC2}$, the transistor NT6 may be turned on ahead of the transistor NT7, and the second voltage $V_{SS}$ may be provided to the first node ND1 earlier than to the second node ND2. If the first output voltage $V_{DAC1}$ is lower than the second output voltage $V_{DAC2}$, the transistor NT6 may be turned on later than the transistor NT7, and the second voltage $V_{SS}$ may be provided to the first node ND1 later than to the second node ND2.

The transistor NT1, which is gated by an output node $V_{LP}$ of the first latch, may be turned on depending on the voltage of the output node $V_{LP}$ of the first latch to provide the first voltage $V_{DD}$ to the third node ND3. As a result, the transistor PT4', which is gated by the output node $V_{LP}$ of the first latch, may be turned on depending on the voltage of the output node $V_{LP}$ of the first latch.

The transistor NT2, which is gated by an output node $V_{LN}$ of the second latch, may be turned on depending on the voltage of the output node $V_{LN}$ of the second latch to provide the first voltage $V_{DD}$ to the fourth node ND4. As a result, the transistor PT3', which is gated by the output node $V_{LN}$ of the first latch, may be turned on depending on the voltage of the output node $V_{LN}$ of the first latch.

Accordingly, the comparator 300 may compare the comparison signal $V_{COMP}$ based on the first and second output voltages $V_{DAC1}$ and $V_{DAC2}$.

Figure 21:
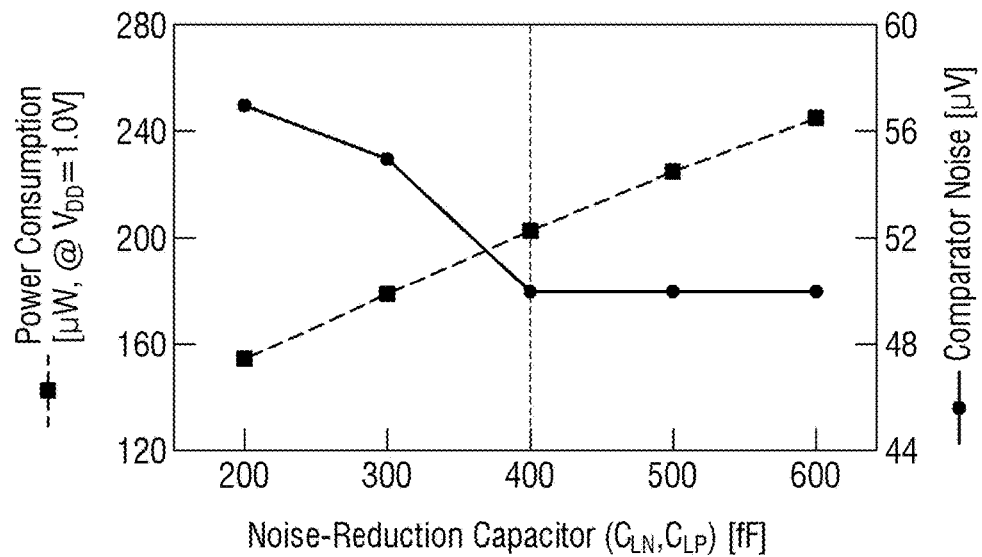
FIG. 21 is a graph showing the power consumption and noise of the comparator of the semiconductor device of FIG. 1 in accordance with the capacitance of the noise reduction capacitors of FIG. 18.

FIG. 21 is a graph showing the power consumption and noise of the comparator of the semiconductor device of FIG. 1 in accordance with the capacitance of the noise reduction capacitors of FIG. 18.

Referring to FIG. 21, as the capacitance of the noise reduction capacitors $C_{LN}$ and $C_{LP}$ increases, the power consumption of the comparator 300 may increase.

If the first voltage $V_{DD}$ is 1 V and the second voltage $V_{SS}$ is a ground voltage, the power consumption of the comparator 300 may decrease as the capacitance of the noise reduction capacitors $C_{LN}$ and $C_{LP}$ increases. However, if the capacitance of the noise reduction capacitors $C_{LN}$ and $C_{LP}$ is about 400 fF or greater, reductions in the noise of the comparator 300 may be insignificant.

Thus, the comparator 300 may include the noise reduction capacitors $C_{LN}$ and $C_{LP}$ having a capacitance of 400 fF. Therefore, the noise of the comparator 300 can be reduced, and the power consumption of the comparator 300 can be improved.

Figure 22:
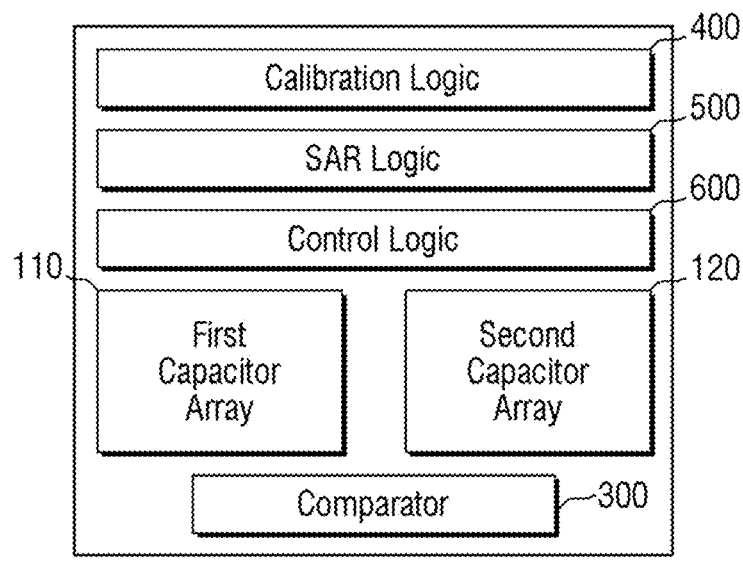
FIG. 22 is a block diagram of a semiconductor device according to some example embodiments of the present disclosure, which is implemented as an on chip.
Figure 23:
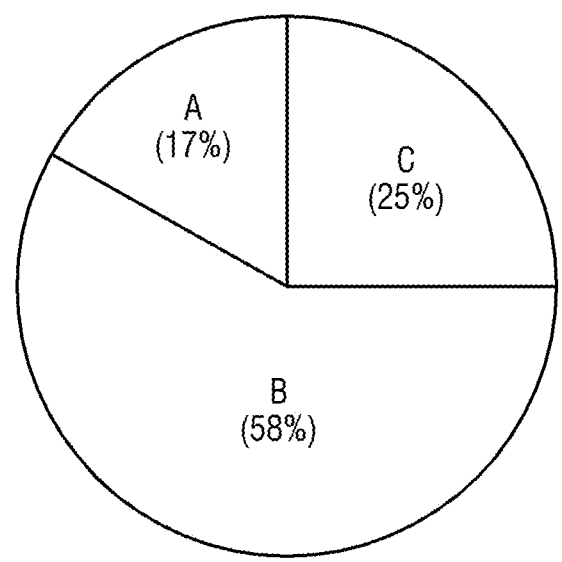
FIG. 23 is a schematic view showing the power consumption of the semiconductor device of FIG. 22.
Figure 24A:
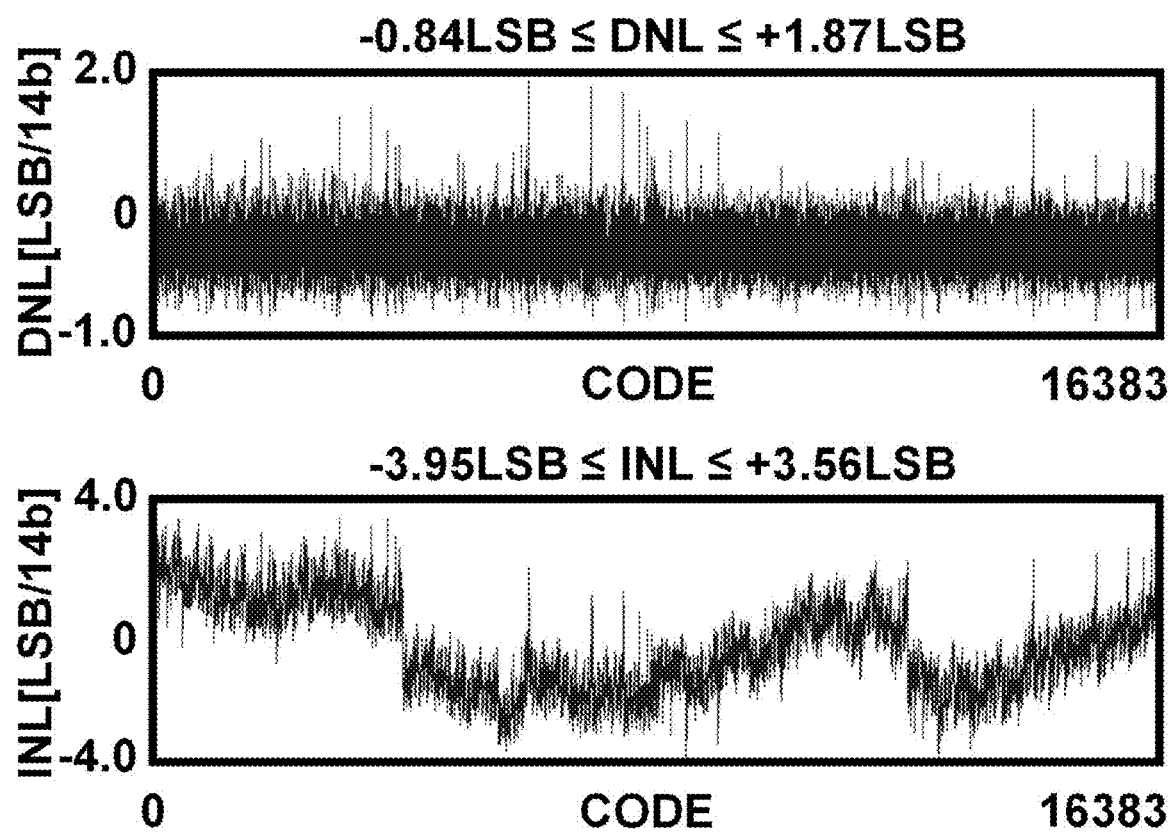
FIGS. 24A and 24B show the differential non-linearity (DNL) and integral non-integrity (INL) of the semiconductor device of FIG. 22.
Figure 24B:
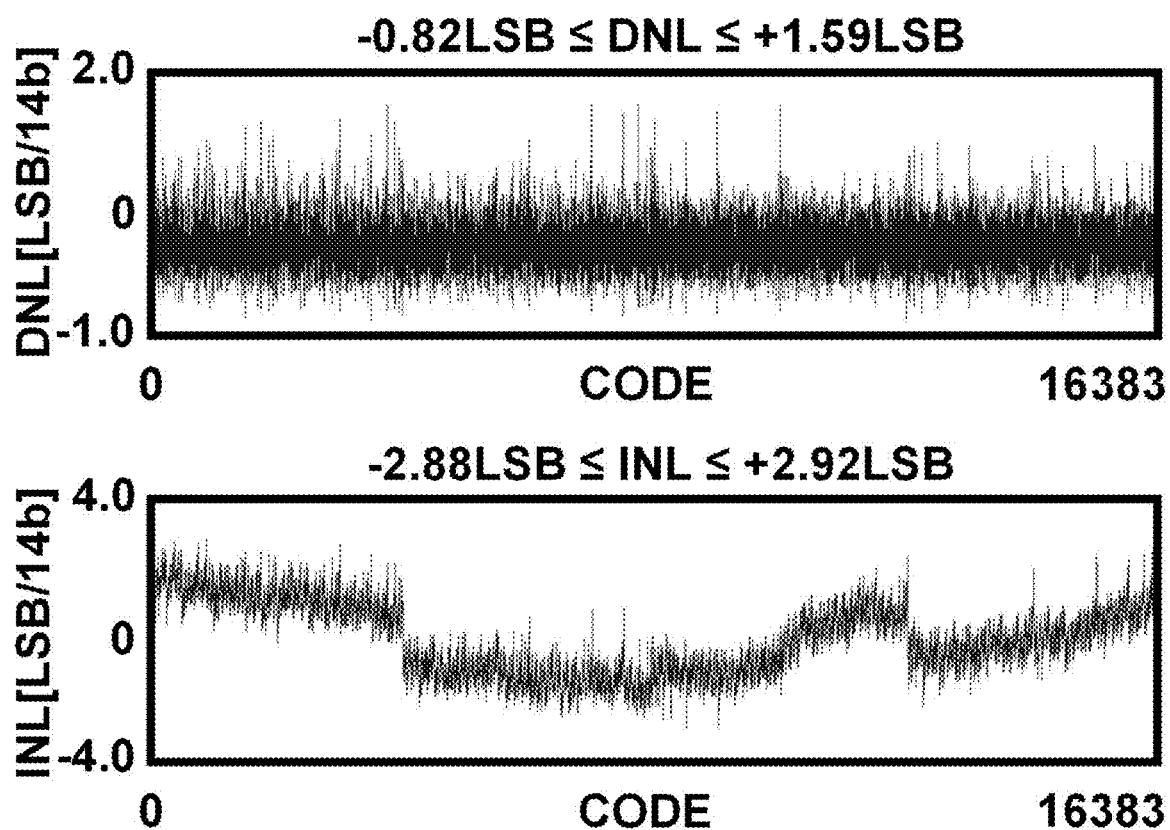

FIG. 22 is a block diagram of a semiconductor device according to some example embodiments of the present disclosure, which is implemented as an on chip. FIG. 23 is a schematic view showing the power consumption of the semiconductor device of FIG. 22. FIGS. 24A and 24B show the differential non-linearity (DNL) and integral non-integrity (INL) of the semiconductor device of FIG. 22, FIGS. 25A and 25B show the fast Fourier transform (FFT) spectrum of the semiconductor device of FIG. 22, and FIGS. 26A and 26B are graphs showing the dynamic performance of the semiconductor device of FIG. 22.

Referring to FIG. 22, a semiconductor device 1 was fabricated as an on chip, particularly, as an SAR ADC having a resolution of 14 bits and a sampling speed of 10 MS/s via 28-nm complementary metal-oxide semiconductor (CMOS) process. The size of the semiconductor device 1 is 0.062 nm$^2$ (=0.27 nm*0.23 nm).

Referring to FIG. 23, the semiconductor device 1 consumes a power of 351 μW when being driven at a sampling speed of 10 MS/S with a power supply voltage of 1 V. A calibration logic 400, an SAR logic 500, and a control logic 600 may account for 17% of the power consumption of the semiconductor device 1, as indicated by "A". A comparator 300 of the semiconductor device 1 may account for 58% of the power consumption of the semiconductor device 1, as indicated by "B". An SAR DAC (110 and 120) may account for 25% of the power consumption of the semiconductor device 1, as indicated by "C".

Figure 25A:
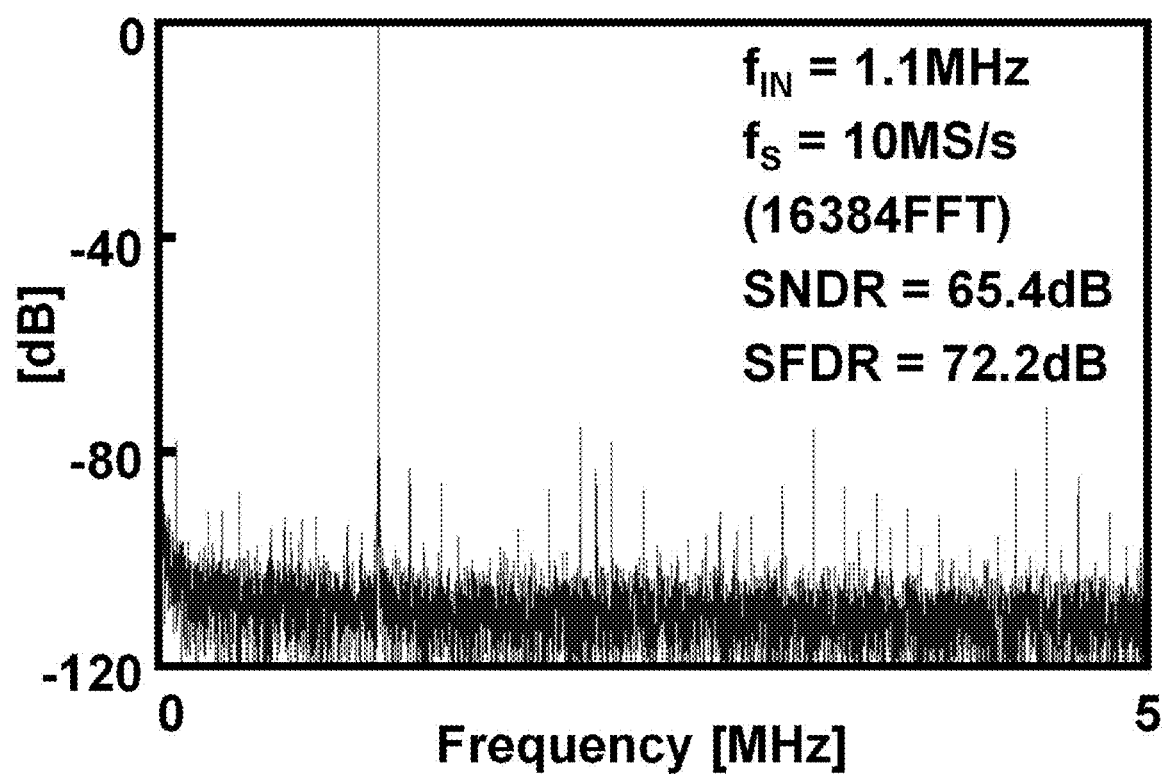
FIGS. 25A and 25B show the fast Fourier transform (FFT) spectrum of the semiconductor device of FIG. 22.
Figure 25B:
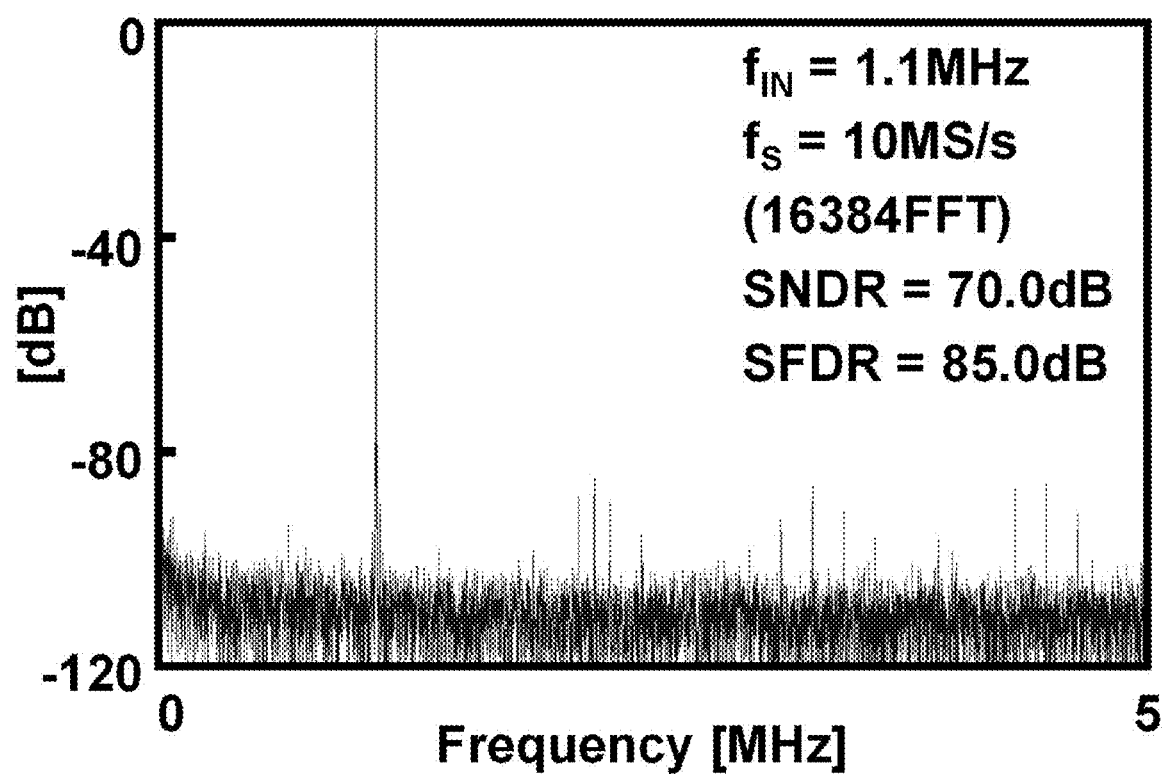
Figure 26A:
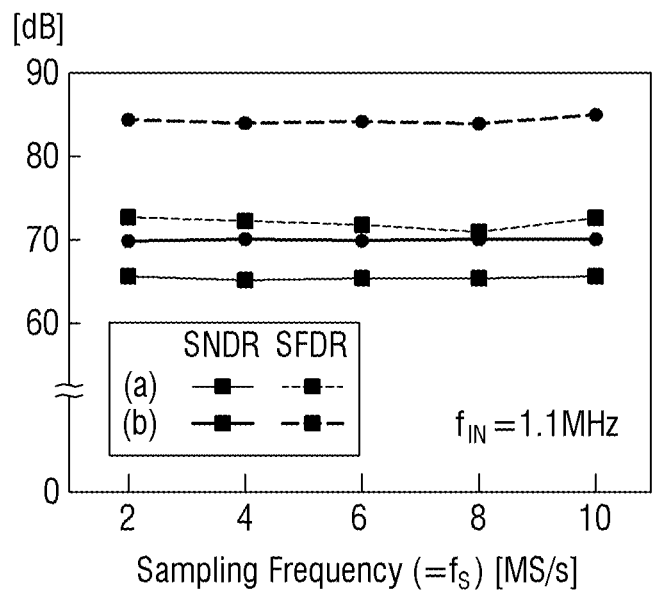
FIGS. 26A and 26B are graphs showing the dynamic performance of the semiconductor device of FIG. 22.
Figure 26B:
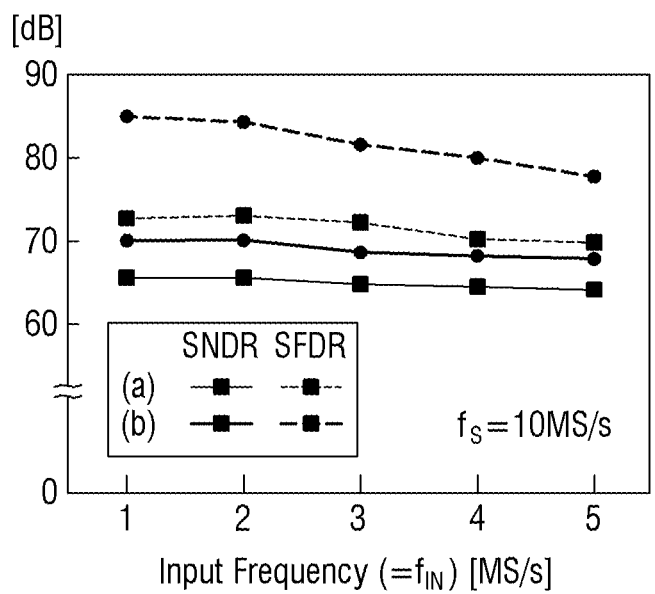

FIGS. 24A and 25A illustrate a semiconductor device having the capacitance of variable capacitors thereof yet to be calibrated, and FIGS. 24B and 25B illustrate a semiconductor device with the capacitance of variable capacitors thereof calibrated.

Referring to FIG. 24A, a semiconductor device having the capacitance of variable capacitors thereof yet to be calibrated shows a DNL of 1.87 LSB and an INL of 3.95 LSB at a 14-bit resolution. On the contrary, referring to FIG. 24B, a semiconductor device according to some example embodiments of the present disclosure having the capacitance of variable capacitors thereof calibrated shows a DNL of 1.59 LSB and an INL of 2.92 LSB at a 14-bit resolution. That is, the range of DNL error and the range of INL for each code of the semiconductor device according to some example embodiments of the present disclosure can be reduced.

Referring to FIG. 25A, the semiconductor device having the capacitance of variable capacitors thereof yet to be calibrated shows a signal-to-noise distortion ration (SNDR) of 65.4 dB and a spurious free dynamic range (SFDR) of 72.2 dB at an input frequency $f_{IN}$ of 1.1 MHz and a sampling speed $f_S$ of 10 MS/s. On the contrary, the semiconductor device according to some example embodiments of the present disclosure has an SNDR of 70.0 dB and an SFDR of 85.0 dB.

FIG. 26A is a graph showing the dynamic performance of semiconductor devices in accordance with a sampling speed. FIG. 26B shows the dynamic performance of semiconductor devices in accordance with an input frequency. Referring to FIGS. 26A and 26B, (a) refers to a semiconductor device having the capacitance of variable capacitors thereof yet to be calibrated, and (b) refers to a semiconductor device according to some example embodiments of the present disclosure having the capacitance of variable capacitors thereof calibrated.

Referring to FIG. 26A, while the sampling speed $f_S$ is increasing up to an input frequency $f_{IN}$ of 1.1 MHz, a semiconductor device having the capacitance of variable capacitors thereof yet to be calibrated shows an SNDR of 65.1 dB or greater and an SFDR of 70.8 dB or greater. On the contrary, while the sampling speed $f_S$ is increasing up to an input frequency $f_{IN}$ of 1.1 MHz, a semiconductor device according to some example embodiments of the present disclosure having the capacitance of variable capacitors thereof calibrated maintains an SNDR of 69.9 dB or greater and an SFDR of 83.9 dB or greater.

Referring to FIG. 26B, while the input frequency $f_{IN}$ is increasing up to an Nyquist frequency of 5 MHz at an sampling speed $f_S$ of 10 MS/s, the semiconductor device having the capacitance of variable capacitors thereof yet to be calibrated shows an SNDR of 64.3 dB or greater and an SFDR of 69.5 dB or greater. On the contrary, while the input frequency $f_{IN}$ is increasing up to an Nyquist frequency of 5 MHz at an sampling speed $f_S$ of 10 MS/s, the semiconductor device according to some example embodiments of the present disclosure having the capacitance of variable capacitors thereof calibrated maintains an SNDR of 67.8 dB or greater and an SFDR of 77.6 dB or greater.

Figure 27:
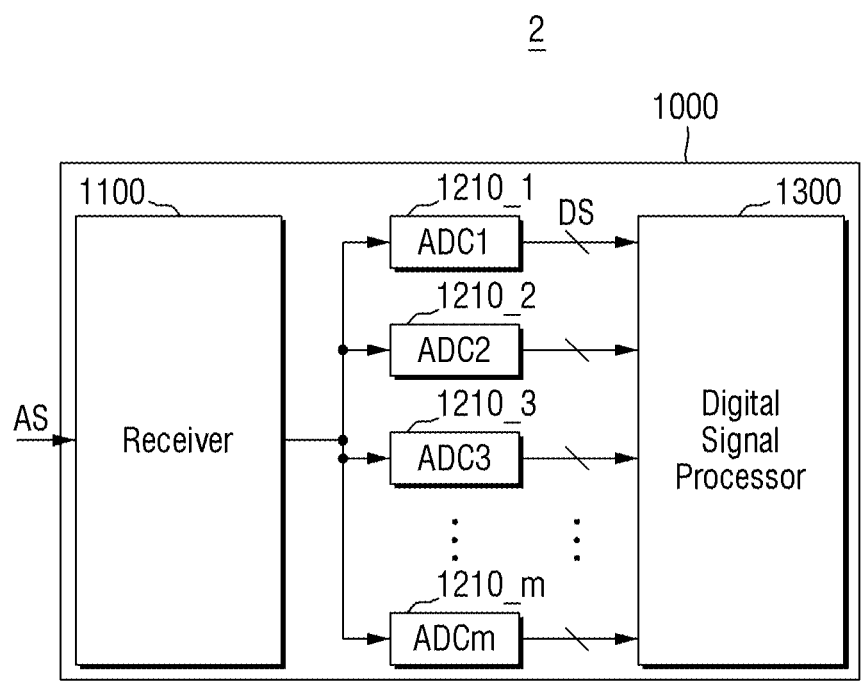
FIG. 27 is a block diagram of a system-on-chip (SoC) according to some example embodiments of the present disclosure.

FIG. 27 is a block diagram of a system-on-chip (SoC) according to some example embodiments of the present disclosure.

Referring to FIG. 27, an SoC 2 may include, for example, a modem device 1000.

The modem device 1000 may include a receiver 1100, a plurality of SAR ADCs 1210_1 through 1210_m, and/or a digital signal processor 1300.

The receiver 1100 may receive an analog signal AS. In some example embodiments, the receiver 1100 may receive a plurality of analog signals AS.

The plurality of SAR ADCs 1210_1 through 1210_m may convert the analog signal AS provided by the receiver 1100 into a digital signal DS via continuous approximation. The SAR ADCs 1210_1 through 1210_m may be, for example, semiconductor devices 1 according to some example embodiments of the present disclosure.

The digital signal processor 1300 may receive the digital signal DS from the SAR ADCs 1210_1 through 1210_m and may perform a digital operation on the digital signal DS.

Figure 28:
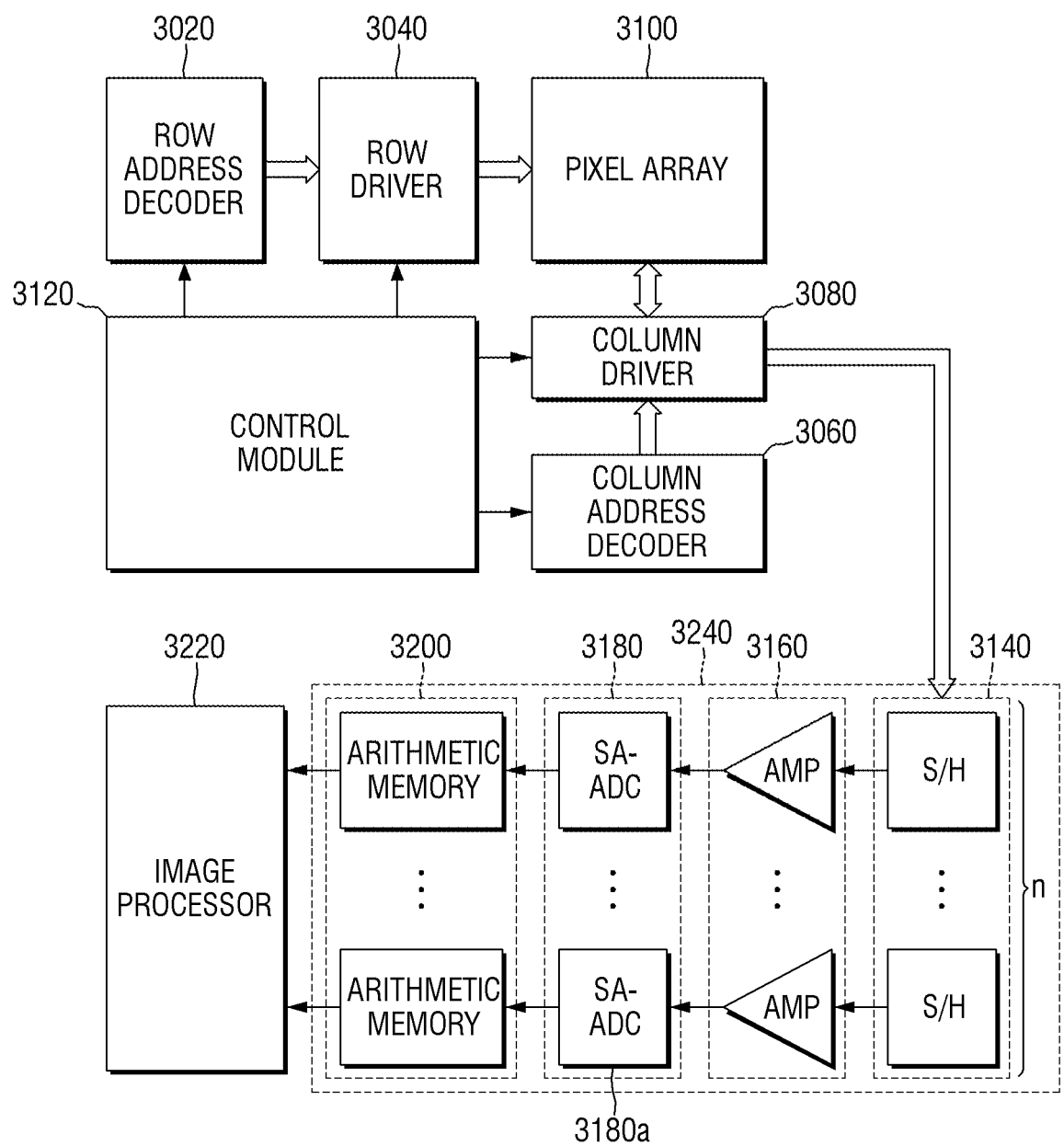
FIG. 28 is a block diagram of an SoC according to some example embodiments of the present disclosure.

FIG. 28 is a block diagram of an SoC according to some example embodiments of the present disclosure.

Referring to FIG. 28, an SoC may include a pixel array 3100, a row driver 3040, a column driver 3080, a control module 3120, a digital correlated double sampling module 3240, and/or an image processor 3220.

The pixel array 3100 may include a plurality of pixels that are arranged in predetermined or alternatively, desired numbers of rows and columns.

For example, rows of pixels in the pixel array 3100 may be turned on at the same time by a row selection line, and pixel signals from each column of pixels in the pixel array 3100 may be selectively provided to output lines by a column selection line. A plurality of row/column selection lines may be provided for the entire pixel array 3100.

The row driver 3040 may selectively enable the row lines in response to a row address decoder 3020. The column driver 3080 may selectively enable the column selection lines in response to a column address decoder 3070. Thus, a row/column address may be provided to each of the pixels in the pixel array 3100.

The control module 3120 may control the row address decoder 3020 and the column address decoder 3070, which select appropriate row and column selection lines, respectively, for reading the pixels in the pixel array 3100.

For example, the control module 3120 may control the row driver 3040 and the column driver 3080, which apply driving voltages to the drive transistors of selected row and column selection lines.

The digital correlated double sampling module 3240 may perform digital correlated double sampling using a pixel reset signal and a pixel image signal for pixels selected from the pixel array 3100.

The digital correlated double sampling module 3240 may include a sample-and-hold (S/H) module 3140, an amplifier module 3160, a successive approximation analog-to-digital converter (SA-ADC) module 3180, and an arithmetic memory module 3200.

The S/H module 3140 is associated with the column driver 3080 and may include n S/H devices "S/H". Each of the S/H devices "S/H" may sample and hold the pixel reset signal and the pixel image signal for the pixels selected from the pixel array 3100. In some example embodiments, n is an integer and may denote to the number of columns of pixels in the pixel array 3100 or refer to some of the columns of pixels in the pixel array 3100.

The amplifier module 3160 may include n amplifiers "AMP" and may amplify the pixel reset signal and the pixel image signal for the pixels sampled and held by the S/H module 3140.

The SA-ADC module 3180 may include n SA-ADCs 3180a, and the n SA-ADCs 3180a may convert the amplified pixel reset signal and the amplified pixel image signal into a digital pixel reset signal and a digital pixel image signal via SA.

Each of the n SA-ADCs 3180a may include, for example, a semiconductor device 1 according to some example embodiments of the present disclosure.

The arithmetic memory module 3200 may include n arithmetic memories "ARITHMETIC MEMORY", and each of the n arithmetic memories "ARITHMETIC MEMORY" may generate a digital differential signal by calculating the difference between the digital pixel reset signal and the digital pixel image signal via MSB-first calculation. In some example embodiments, MSB-first calculation may include a binary addition or subtraction.

The image processor 3220 may process the digital differential signal provided by the arithmetic memory module 3200 and provide an output image color reproduction of an image captured by the pixels of the pixel array 3020.

For example, the image processor 3220 may perform various operations, and the various operations may include, for example, positional gain adjustment, defect correction, noise reduction, optical crosstalk reduction, demosaicing, resizing, and/or sharpening, but the present disclosure is not limited thereto.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Example embodiments of the present disclosure have been described above with reference to the accompanying drawings, but the present disclosure is not limited to the above-described example embodiments, but may be manufactured in various different forms. Those skilled in the art will understand that the present disclosure can be implemented in other specific forms without changing the technical spirit or essential features of the present disclosure. Therefore, it should be understood that the above-described example embodiments are merely illustrative in all respects, but not limiting.

What is claimed is:

1. An analog-to-digital conversion device comprising:
   an analog circuit configured to output an analog input signal; and
   an analog-to-digital converter configured to receive the analog input signal and configured to output a digital output signal corresponding to the analog input signal with the use of first and second capacitor arrays, each of the first and second capacitor arrays including a first capacitor group including a plurality of variable capacitors, a second capacitor group including at least one fixed capacitor, and lower capacitors,
   wherein the analog-to-digital converter is configured to calibrate the capacitance of the first capacitor group by providing a first calibration voltage to at least one of the plurality of variable capacitors and outputs the digital output signal corresponding to the analog input signal with the use of the calibrated capacitance of the first capacitor group,
   the analog-to-digital converter is configured to provide a first reference voltage to the first capacitor group, is configured to provide a second reference voltage having the same magnitude as, but a different sign from, the first reference voltage to the second capacitor group, and is configured to compare the capacitance of the first capacitor group with the capacitance of the second capacitor group, and
   the first capacitor array includes
      a first switch group, configured to connect one of the lower capacitors and the fixed capacitor to one of the first reference voltage and a common mode voltage in accordance with a selection signal, and
      a second switch group, configured to connect one of the variable capacitors to one of the second reference voltage and the common mode voltage, and the common mode voltage to the other lower capacitors and the other variable capacitors in accordance with the selection signal.

2. The analog-to-digital conversion device of claim 1, wherein the analog-to-digital converter is configured to compare the capacitance of the first capacitor group with the capacitance of the second capacitor group and is configured to provide the first calibration voltage to at least one of the plurality of variable capacitors based on a result of a comparison of the capacitance of the first capacitor group with the capacitance of the second capacitor group.

3. The analog-to-digital conversion device of claim 1, wherein
   the analog-to-digital converter is configured to provide the first calibration voltage to at least one of the plurality of variable capacitors based on a result of a comparison of the capacitance of the first capacitor group with the capacitance of the second capacitor group.

4. The analog-to-digital conversion device of claim 3, wherein
   if the capacitance of group is greater than the capacitance of the second capacitor group, the analog-to-digital converter is configured to provide the first calibration voltage having the same sign as the second reference voltage to at least one of the plurality of variable capacitors, and
   if the capacitance of the first capacitor group is smaller than the capacitance of the second capacitor group, the analog-to-digital converter is configured to provide the first calibration voltage having the same sign as the first reference voltage to at least one of the plurality of variable capacitors.

5. The analog-to-digital conversion device of claim 3, wherein the first calibration voltage is $(1/2)^n$ times the first reference voltage (where n is a natural number).

6. The analog-to-digital conversion device of claim 1, wherein
   the plurality of variable capacitors include first and second calibration capacitors having the same capacitance, and
   the analog-to-digital converter is configured to provide the first calibration voltage to the first calibration capacitor based on a result of a comparison of the capacitance of the first capacitor group with the capacitance of the second capacitor group, is configured to compare the calibrated capacitance of the first capacitor group with the capacitance of the second capacitor group, and is configured to provide a second calibration voltage, which is different from the first calibration voltage, based on the result of the comparison of the calibrated capacitance of the first capacitor group with the capacitance of the second capacitor group.

7. The analog-to-digital conversion device of claim 6, wherein the analog-to-digital converter is configured to provide the first calibration voltage to the first calibration capacitor, is configured to provide the first reference voltage to the first capacitor group, is configured to provide the second reference voltage having the same magnitude as, but a different sign from, the first reference voltage to the second capacitor group, and is configured to compare the calibrated capacitance of the first capacitor group with the capacitance of the second capacitor group.

8. The analog-to-digital conversion device of claim 1, wherein
the first capacitor group includes first and second upper capacitors, which are different from each other,
the plurality of variable capacitors include a first calibration capacitor, which is connected to the first upper capacitor, and a second calibration capacitor, which is connected to the second upper capacitor, and
the analog-to-digital converter is configured to calibrate the capacitance of the first upper capacitor by providing the first calibration voltage to the first calibration capacitor, and is configured to calibrate the capacitance of the second upper capacitor with the use of the calibrated capacitance of the first upper capacitor and the capacitance of the second capacitor group.

9. The analog-to-digital conversion device of claim 8, wherein the analog-to-digital converter is configured to provide the common mode voltage to the second upper capacitor while calibrating the capacitance of the first upper capacitor.

10. The analog-to-digital conversion device of claim 8, wherein
the analog-to-digital converter is configured to provide the first reference voltage to the second upper capacitor, is configured to provide the first calibration voltage to the first calibration capacitor, is configured to provide the second reference voltage having the same magnitude as, but a different sign from, the first reference voltage to the second capacitor group, and is configured to compare the capacitance of the second capacitor group with a sum of the calibrated capacitance of the first upper capacitor and the capacitance of the second capacitor group, and
the analog-to-digital converter is configured to provide a second calibration voltage, which is different from the first calibration voltage, to the second calibration capacitor based on the result of the comparison of the capacitance of the second capacitor group with the sum of the calibrated capacitance of the first upper capacitor and the capacitance of the second capacitor group.

11. An analog-to-digital conversion device comprising:
a plurality of upper capacitors configured to determine upper bits of a digital output signal corresponding to an analog input signal;
a plurality of calibration capacitors connected to at least some of the upper capacitors;
a plurality of lower capacitors configured to determine lower bits of the digital output signal; and
a differential reference voltage generation logic configured to receive first and second reference voltages and configured to generate a first differential reference voltage, which is $(1/2)^n$ times the first reference voltage (where n is a natural number), and a second differential reference voltage, which is $(1/2)^n$ times the second reference voltage,
wherein
the calibration capacitors are configured to receive one of the first and second differential reference voltages from the differential voltage generation logic,
the capacitance of the upper capacitors has a binary weight structure due to the calibration capacitors, and
the calibration capacitors and the lower capacitors have the same capacitance,
the upper capacitors include
a plurality of variable capacitors, which include the calibration capacitors and a plurality of non-variable capacitors, which do not include the calibration capacitors,
a first switch group, configured to connect one of the lower capacitors and the non-variable capacitors to one of the first reference voltage and a common mode voltage, in accordance with a selection signal, and
a second switch group, configured to connect one of the variable capacitors to one of the second reference voltage and the common mode voltage, and the common mode voltage to the other lower capacitors and the other variable capacitors, in accordance with the selection signal.

12. The analog-to-digital conversion device of claim 11, a calibration logic, configured to output the selection signal that selects one of the upper variable capacitors.

13. The analog-to-digital conversion device of claim 11, wherein
the first differential reference voltage includes (1-1)- and (1-2)-th differential voltages, which are different from each other,
the second differential reference voltage includes (2-1)- and (2-2)-th differential voltages, which are different from each other, and
the calibration capacitors include a first calibration capacitor, which is connected to one of the (1-1)- and (1-2)-th differential reference voltages, and a second calibration capacitor, which is connected to one of the (2-1)- and (2-2)-th differential reference voltages.

14. The analog-to-digital conversion device of claim 11, wherein the differential reference voltage generation logic includes a plurality of resistors, which are connected in series, and is configured to generate the first and second differential reference voltages.

15. The analog-to-digital conversion device of claim 11, wherein the number of calibration capacitors is smaller than the numbers of first differential reference voltages and second differential reference voltages.

16. The analog-to-digital conversion device of claim 11, wherein the number of lower capacitors is the same as the numbers of first differential reference voltages and second differential reference voltages.

17. The analog-to-digital conversion device of claim 11, wherein the number of lower capacitors is smaller than the numbers of first differential reference voltages and second differential reference voltages.

18. An analog-to-digital conversion device comprising:
a first capacitor array including a first variable capacitor group, which includes a first calibration capacitor having first capacitance, a first non-variable capacitor group, which does not include the first calibration capacitor, and a first lower capacitor group;
a second capacitor array including a second variable capacitor group, which includes a second calibration capacitor group having second capacitance, a second non-variable capacitor group, which does not include the second calibration group capacitor, and a second lower capacitor group;
a comparator including a first node, to which the output of the first capacitor array is connected, and a second node, to which the output of the second capacitor array is connected;
a resistor string having a plurality of resistors connected in series and configured to generate a first differential reference voltage, which is obtained by dividing a first reference voltage, and a second differential reference voltage, which is obtained by dividing a second reference voltage; and a calibration logic connecting one of the first and second differential reference voltages to one of the first and second calibration capacitor groups in accordance with a first output signal of the comparator, wherein the capacitance of the first variable capacitor group is changed by the first calibration capacitor, the capacitance of the second variable capacitor group is changed by the second calibration capacitor, the first and second lower capacitor groups have the first capacitance, the capacitances of the first variable capacitor group and the first non-variable capacitor group have a binary weight structure due to the first calibration capacitor, the capacitances of the second variable capacitor group and the second non-variable capacitor group have a binary weight structure due to the second calibration capacitor, the first lower capacitor group includes (1-1)- and (1-2)-th lower capacitors, and the first capacitor array further includes a first switch group, configured to connect one of an analog input signal, a common mode voltage, the first reference voltage, and the second reference voltage to the first variable capacitor group and the first non-variable capacitor group, a second switch group, configured to connect one of the analog input signal, the common mode voltage, the first differential reference voltage, and the second differential reference voltage to the (1-1)-th lower capacitor, and a third switch group, configured to connect one of the common mode voltage, the first differential reference voltage, and the second differential reference voltage to the (1-2)-th lower capacitor.

19. The analog-to-digital conversion device of claim 18, wherein the second lower capacitor group includes (2-1)- and (2-2)-th lower capacitors, the second capacitor array includes a fourth switch group, configured to connect one of the analog input signal, the common mode voltage, the first reference voltage, and the second reference voltage to the second variable capacitor group and the second non-variable capacitor group, a fifth switch group, configured to connect one of the analog input signal, the common mode voltage, the first differential reference voltage, and the second differential reference voltage to the (2-1)-th lower capacitor, and a sixth switch group, configured to connect one of the common mode voltage, the first differential reference voltage, and the second differential reference voltage to the (2-2)-th lower capacitor.

* * * * *